(12) United States Patent
Taylor et al.

(10) Patent No.: US 8,170,091 B2
(45) Date of Patent: May 1, 2012

(54) 1K MODE INTERLEAVER IN A DIGITAL VIDEO BROADCASTING (DVB) STANDARD

(75) Inventors: Matthew Paul Athol Taylor, Ringwood (GB); Samuel Asanbeng Atungsiri, Basingstoke (GB); John Nicholas Wilson, Hook (GB)

(73) Assignee: Sony Corporation, Tokyo (JP)

( * ) Notice: Subject to any disclaimer, the term of this patent is extended or adjusted under 35 U.S.C. 154(b) by 649 days.

(21) Appl. No.: 12/256,746

(22) Filed: Oct. 23, 2008

(65) Prior Publication Data

US 2009/0110095 A1 Apr. 30, 2009

(30) Foreign Application Priority Data

| Oct. 30, 2007 | (GB) | 0721269.9 |
| Oct. 30, 2007 | (GB) | 0721270.7 |
| Nov. 19, 2007 | (GB) | 0722645.9 |
| Nov. 20, 2007 | (GB) | 0722728.3 |

(51) Int. Cl.
*H03H 7/30* (2006.01)

(52) U.S. Cl. ........... 375/230; 375/260; 455/59; 370/203

(58) Field of Classification Search .................. 375/230, 375/260; 455/59; 370/203
See application file for complete search history.

(56) References Cited

U.S. PATENT DOCUMENTS

| 5,799,033 | A | 8/1998 | Baggen | |
| 6,314,534 | B1* | 11/2001 | Agrawal et al. | 714/702 |
| 6,353,900 | B1 | 3/2002 | Sindhushayana et al. | |
| 6,625,234 | B1* | 9/2003 | Cui et al. | 375/341 |
| 6,944,120 | B2 | 9/2005 | Wu et al. | |
| 7,543,197 | B2* | 6/2009 | Palanki et al. | 714/701 |
| 2002/0186797 | A1* | 12/2002 | Robinson | 375/341 |
| 2004/0246888 | A1* | 12/2004 | Peron | 370/208 |
| 2005/0008084 | A1* | 1/2005 | Zhidkov | 375/260 |
| 2006/0062314 | A1* | 3/2006 | Palin et al. | 375/260 |
| 2006/0123323 | A1* | 6/2006 | Kim et al. | 714/763 |

(Continued)

FOREIGN PATENT DOCUMENTS

EP 1 255 408 A1 11/2002

(Continued)

OTHER PUBLICATIONS

Afshari, "A Novel Symbol Interleaver Address Generation Architecture for DVB-T Modulator" International Symposium on Communications and Information Technologies, 2006, ISCIT '06, Publication Year: 2006, pp. 989-993.*

(Continued)

*Primary Examiner* — Juan A Torres
(74) *Attorney, Agent, or Firm* — Oblon, Spivak, McClelland, Maier & Neustadt, L.L.P.

(57) ABSTRACT

A data processor maps input symbols to be communicated onto a predetermined number of sub-carrier signals of an Orthogonal Frequency Division Multiplexed (OFDM) symbol. The data processor includes an interleaver memory which reads-in the predetermined number of data symbols for mapping onto the OFDM sub-carrier signals. The interleaver memory reads-out the data symbols on to the OFDM sub-carriers to effect the mapping, the read-out being in a different order than the read-in, the order being determined from a set of addresses, with the effect that the data symbols are interleaved on to the sub-carrier signals. The set of addresses are generated from an address generator which comprises a linear feedback shift register and a permutation circuit.

21 Claims, 12 Drawing Sheets

U.S. PATENT DOCUMENTS

| | | | |
|---|---|---|---|
| 2006/0256708 A1* | 11/2006 | Wang et al. | 370/206 |
| 2006/0282712 A1 | 12/2006 | Argon et al. | |
| 2007/0139428 A1* | 6/2007 | Berkeman | 345/565 |
| 2007/0250742 A1 | 10/2007 | Kowalski | |
| 2009/0300300 A1* | 12/2009 | Treigherman | 711/157 |

FOREIGN PATENT DOCUMENTS

| | | |
|---|---|---|
| EP | 1 463 255 A1 | 9/2004 |
| EP | 1 463 256 A1 | 9/2004 |
| EP | 1 635 473 A2 | 3/2006 |
| EP | 1 662 739 A1 | 5/2006 |
| GB | 2 342 546 A | 4/2000 |
| WO | WO 2005/091509 A1 | 9/2005 |
| WO | WO 2006/136883 A1 | 12/2006 |

OTHER PUBLICATIONS

Li, "Hardware implementation of DVB-RCTT modulator", ECS of ICT, KTH Feb. 2006 (see http://web.it.kth.se/~srs/MSc_theses/Zhu_Lei+Shenjiang_Li_MSc-thesis.pdf).*

U.S. Appl. No. 12/249,294, filed Oct. 10, 2008, Taylor et al.
U.S. Appl. No. 12/249,276, filed Oct. 10, 2008, Taylor et al.
U.S. Appl. No. 12/249,306, filed Oct. 10, 2008, Taylor et al.
U.S. Appl. No. 12/256,095, filed Oct. 22, 2008, Taylor et al.
U.S. Appl. No. 12/260,327, filed Oct. 29, 2008, Taylor et al.
U.S. Appl. No. 12/257,999, filed Oct. 24, 2008, Taylor et al.
U.S. Appl. No. 12/257,010, filed Oct. 23, 2008, Taylor et al.
Gerard Faria, "DVB-RCT: A Standard for Interactive DVB-T", IBC 2001 Conference Publication, XP-002509443, 2001, 13 pages.
U.S. Appl. No. 12/435,657, filed May 5, 2009, Atungsiri et al.
U.S. Appl. No. 12/437,207, filed May 7, 2009, Atungsiri et al.
Dr. Jonathan DeVile, "Reply to examination report' Letter for EP1463256", Aug. 2, 2005, 4 pages.
"Digital Video Broadcasting (DVB); Framing structure, channel coding and modulation for digital terrestrial television", ETSI EN 300 744 V1.4.1, Jan. 2001, 4 pages.
Imed Ben Dhaou, et al., "Performance analysis and low power VLSI implementaition of DVB-T receiver", OFDM and DVB-T presentation, Mar. 4, 1999, 3 pages.
Final draft ETSI EN 300 744 V1.5.1, "Digital Video Broadcasting (DVB); Framing structure, channel coding and modulation for digital terrestrial television", European Standard (Telecommunications series), Institute (ETSI), (Nov. 2004), pp. 1-64.
Marc M. Darmon, et al., "A New Pseudo-Random Interleaving for Antijamming Applications", IEEE Military Communications Conference Record, published Oct. 15-18, 1989, IEEE, vol. 1, pp. 6-10.

* cited by examiner

1K MODE INTERLEAVER IN A DIGITAL VIDEO BROADCASTING (DVB) STANDARD

FIELD OF INVENTION

The present invention relates to data processing apparatus operable to map input data symbols onto sub-carrier signals of Orthogonal Frequency Division Multiplexed (OFDM) symbols. The present invention also relates to an address generator for use in writing symbols to/reading symbols from an interleaver memory.

The present invention also relates to data processing apparatus operable to map data symbols received from a predetermined number of sub-carrier signals of OFDM symbols into an output symbol stream.

Embodiments of the present invention can provide an OFDM transmitter/receiver.

BACKGROUND OF THE INVENTION

The Digital Video Broadcasting-Terrestrial standard (DVB-T) utilises Orthogonal Frequency Division Multiplexing (OFDM) to communicate data representing video images and sound to receivers via a broadcast radio communications signal. There are known to be two modes for the DVB-T standard which are known as the 2 k and the 8 k mode. The 2 k mode provides 2048 sub-carriers whereas the 8 k mode provides 8192 sub-carriers. Similarly for the Digital Video Broadcasting-Handheld standard (DVB-H) a 4 k mode has been provided, in which the number of sub-carriers is 4096.

In order to improve the integrity of data communicated using DVB-T or DVB-H a symbol interleaver is provided in order to interleave input data symbols as these symbols are mapped onto the sub-carrier signals of an OFDM symbol. Such a symbol interleaver comprises an interleaver memory in combination with an address generator. The address generator generates an address for each of the input symbols, each address indicating one of the sub-carrier signals of the OFDM symbol onto which the data symbol is to be mapped. For the 2 k mode and the 8 k mode an arrangement has been disclosed in the DVB-T standard for generating the addresses for the mapping. Likewise for the 4 k mode of DVB-H standard, an arrangement for generating addresses for the mapping has been provided and an address generator for implementing this mapping is disclosed in European Patent application 04251667.4. The address generator comprises a linear feed back shift register which is operable to generate a pseudo random bit sequence and a permutation circuit. The permutation circuit permutes the order of the content of the linear feed back shift register in order to generate an address. The address provides an indication of a memory location of the interleaver memory for writing the input data symbol into or reading the input data symbol out from the interleaver memory for mapping onto one of the sub-carrier signal of the OFDM symbol. Similarly, an address generator in the receiver is arranged to generate addresses of the interleaver memory for writing the received data symbols into or reading the data symbols out from the interleaver memory to form an output data stream.

In accordance with a further development of the Digital Video Broadcasting-Terrestrial broadcasting standard, known as DVB-T2 there has been proposed that further modes for communicating data be provided.

SUMMARY OF INVENTION

According to an aspect of the present invention there is provided a data processing apparatus operable to map input data symbols to be communicated onto a predetermined number of sub-carrier signals of an Orthogonal Frequency Division Multiplexed (OFDM) symbol. The data processing apparatus comprises an interleaver operable to read-into an interleaver memory the predetermined number of input data symbols for mapping onto the OFDM sub-carrier signals, and to read-out of the interleaver memory the input data symbols for the OFDM sub-carriers to effect the mapping. The read-out is in a different order than the read-in, the order being determined from a set of addresses, with the effect that the input data symbols are interleaved on the sub-carrier signals. The set of addresses is determined by an address generator, an address being generated for each of the input symbols to indicate one of the sub-carrier signals onto which the data symbol is to be mapped.

The address generator comprises a linear feedback shift register including a predetermined number of register stages and is operable to generate a pseudo-random bit sequence in accordance with a generator polynomial, and a permutation circuit and a control unit. The permutation circuit is operable to receive the content of the shift register stages and to permute the bits present in the register stages in accordance with a permutation code to form an address of one of the OFDM sub-carriers.

The control unit is operable in combination with an address check circuit to re-generate an address when a generated address exceeds a predetermined maximum valid address. The data processing apparatus is characterised in that the predetermined maximum valid address is less than one thousand and twenty four, the linear feedback shift register has nine register stages with a generator polynomial for the linear feedback shift register of $R'_i[8]=R'_{i-1}[0] \oplus R'_{i-1}[4]$, and the permutation code forms with an additional bit, a ten bit address $R_i[n]$ for the i-th data symbol from the bit present in the n-th register stage $R'_i[n]$ in accordance with the table:

| $R'_i$ bit positions | 8 | 7 | 6 | 5 | 4 | 3 | 2 | 1 | 0 |
|---|---|---|---|---|---|---|---|---|---|
| $R_i$ bit positions | 4 | 3 | 2 | 1 | 0 | 5 | 6 | 7 | 8 |

Although it is known within the DVB-T standard to provide the 2 k mode and the 8 k mode, and the DVB-H standard provides a 4 k mode, there has been proposed to provide a 1 k mode for DVB-T2. Whilst the 8 k mode provides an arrangement for establishing a single frequency network with sufficient guard periods to accommodate larger propagation delays between DVB transmitters, the 2 k mode is known to provide an advantage in mobile applications. This is because the 2 k symbol period is only one quarter of the 8 k symbol period, allowing the channel estimation to be more frequently updated allowing the receiver to track the time variation of the channel due to doppler and other effects more accurately. The 2 k mode is therefore advantageous for mobile applications. However, it has been proposed that an OFDM communications system according to the DVB-T2 standard is required to communicate in even harsher environments, which require a receiver to perform with greater time variations in the communications channel, such as mobile applications. Therefore a 1 k mode has been proposed, although with the 1 k mode a multiple frequency network will be required complicating an arrangement of transmitters to provide a broadcast system. However, in order to provide the 1 k mode, a symbol interleaver must be provided for mapping the input data symbols onto the sub-carrier signals of the OFDM symbol.

Embodiments of the present invention can provide a data processing apparatus operable as a symbol interleaver for mapping data symbols to be communicated on an OFDM symbol, having substantially one thousand sub-carrier signals. In one embodiment the number of sub-carrier signals maybe a value substantially between seven hundred and one thousand and twenty four. Furthermore, the OFDM symbols may include pilot sub-carriers, which are arranged to carry known symbols, and the predetermined maximum valid address depends on a number of the pilot sub-carrier symbols present in the OFDM symbol. As such the 1 k mode can be provided for example for a DVB standard, such as DVB-T2, DVB-T or DVB-H.

Mapping data symbols to be transmitted onto the sub-carrier signals of an OFDM symbol, where the number of sub-carrier signals is approximately one thousand, represents a technical problem requiring simulation analysis and testing to establish an appropriate generator polynomial for the linear feedback shift register and the permutation order. This is because the mapping requires that the symbols are interleaved onto the sub-carrier signals with the effect that successive symbols from the input data stream are separated in frequency by a greatest possible amount in order to optimise the performance of error correction coding schemes.

Error correction coding schemes such as Low Density Parity Check/Bose-Chaudhuri-Hocquenghem (LDPC/BCH) coding, which has been proposed for DVB-T2 perform better when noise and degradation of the symbol values resulting from communication is un-correlated. Terrestrial broadcast channels may suffer from correlated fading in both the time and the frequency domains. As such by separating encoded symbols on to different sub-carrier signals of the OFDM symbol by as much as possible, the performance of error correction coding schemes can be increased.

As will be explained, it has been discovered from simulation performance analysis that the generator polynomial for the linear feed back shift register in combination with the permutation circuit order indicated above, provides a good performance. Furthermore, by providing an arrangement which can implement address generating for each of the 2 k mode, the 4 k mode and the 8 k mode by changing the taps of the generator polynomial for the linear feed back shift register and the permutation order, a cost effective implementation of the symbol interleaver for the 1 k mode can be provided. Furthermore, a transmitter and a receiver can be changed between the 1 k mode, 2 k mode, 4 k mode, the 8 k mode and the 16 k mode by changing the generator polynomial and the permutation orders. This can be effected in software (or by the embedded signalling) whereby a flexible implementation is provided.

The additional bit, which is used to form the address from the content of the linear feedback shift register, may be produced by a toggle circuit, which changes from 1 to 0 for each address, so as to reduce a likelihood that if an address exceeds the predetermined maximum valid address, then the next address will be a valid address. In one example the additional bit is the most significant bit.

In one example the above permutation code is used to generate the addresses for performing the interleaving for successive OFDM symbols. In other examples, the above permutation code is one of a plurality of permutation codes which are changed so as to reduce a possibility that successive or data bits which are close in order in an input data stream are mapped onto the same sub-carrier of an OFDM symbol. In one example, a different permutation code is used for performing the interleaving between successive OFDM symbols. The use of different permutation codes for successive OFDM symbols can provide an advantage where the data processing apparatus is operable to interleave the input data symbols onto the sub-carrier signals of both even and odd OFDM symbols for a transmitter only by reading in the data symbols into the memory in a sequential order and reading out the data symbols from the memory in accordance with the set of addresses generated by the address generator and for a receiver only by reading in the data symbols into the memory in accordance with the set of addresses generated by the address generator and reading out the data symbols from the memory in a sequential order.

Various aspects and features of the present invention are defined in the appended claims. Further aspects of the present invention include a data processing apparatus and method operable to map symbols received from a predetermined number of sub-carrier signals of an Orthogonal Frequency Division Multiplexed (OFDM) symbol into an output symbol stream, as well as a transmitter and a receiver.

BRIEF DESCRIPTION OF DRAWINGS

Embodiments of the present invention will now be described by way of example only with reference to the accompanying drawings, wherein like parts are provided with corresponding reference numerals, and in which:

FIG. 6(a) is diagram illustrating results for an interleaver using the address generator shown in FIG. 5 for even symbols and FIG. 6(b) is a diagram illustrating design simulation results for odd symbols, whereas

DESCRIPTION OF PREFERRED EMBODIMENTS

It has been proposed that the number of modes, which are available within the DVB-T2 standard should be extended to include a 1 k mode, a 16 k mode and a 32 k mode. The following description is provided to illustrate the operation of a symbol interleaver in accordance with the present technique, although it will be appreciated that the symbol interleaver can be used with other modes and other DVB standards.

Figure 1:
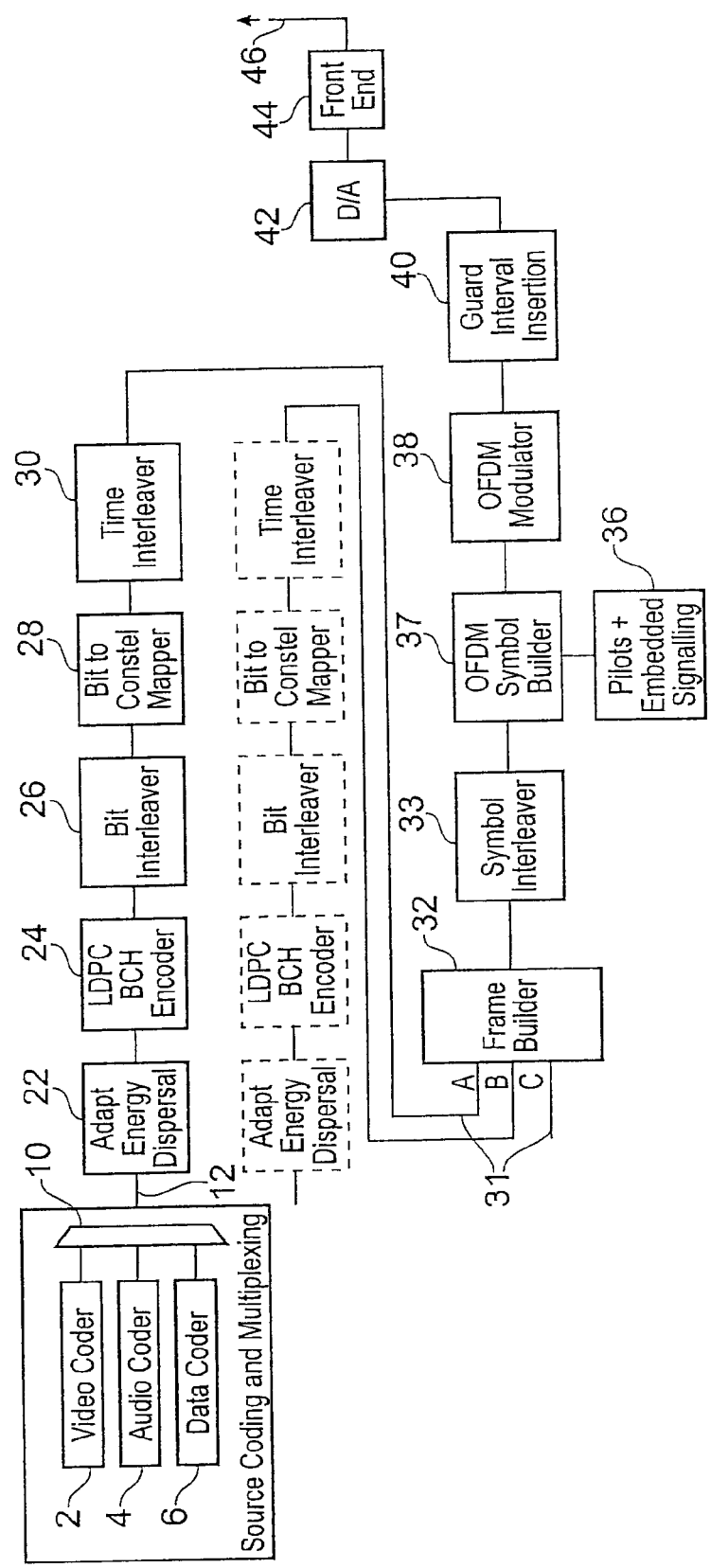
FIG. 1 is a schematic block diagram of a Coded OFDM transmitter which may be used, for example, with the DVB-T2 standard.

FIG. 1 provides an example block diagram of a Coded OFDM transmitter which may be used for example to transmit video images and audio signals in accordance with the DVB-T2 standard. In FIG. 1 a program source generates data to be transmitted by the Coded Orthogonal Frequency Division Multiplexing (COFDM) transmitter. A video coder 2, and audio coder 4 and a data coder 6 generate video, audio and other data to be transmitted which are fed to a program multiplexer 10. The output of the program multiplexer 10 forms a multiplexed stream with other information required to communicate the video, audio and other data. The multiplexer 10 provides a stream on a connecting channel 12. There may be many such multiplexed streams which are fed into different branches A, B etc. For simplicity, only branch A will be described.

As shown in FIG. 1 a COFDM transmitter receives the stream at a multiplexer adaptation and energy dispersal block 22. The multiplexer adaptation and energy dispersal block 22 randomises the data and feeds the appropriate data to a forward error correction encoder 24 which performs error correction encoding of the stream. A bit interleaver 26 is provided to interleave the encoded data bits which for the example of DVB-T2 is the LDCP/BCH encoder output. The output from the bit interleaver 26 is fed to a bit into constellation mapper 28, which maps groups of bits onto a constellation point, which is to be used for conveying the encoded data bits. The outputs from the bit into constellation mapper 28 are constellation point labels that represent real and imaginary components. The constellation point labels represent data symbols formed from two or more bits depending on the modulation scheme used. These will be referred to as data cells. These data cells are passed through a time-interleaver 30 whose effect is to interleaver data cells resulting from multiple LDPC code words.

The data cells are received by a frame builder 32, with data cells produced by branch B etc in FIG. 1, via other channels 31. The frame builder 32 then forms many data cells into sequences to be conveyed on COFDM symbols, where a COFDM symbol comprises a number of data cells, each data cell being mapped onto one of the sub-carriers. The number of sub-carriers will depend on the mode of operation of the system, which may include one of 1 k, 2 k, 4 k, 8 k, 16 k or 32 k, each of which provides a different number of sub-carriers according, for example to the following table:

| Number of Sub-carriers Adapted from DVB-T/H | |
| --- | --- |
| Mode | Sub-carriers |
| 1k | 756 |
| 2k | 1512 |
| 4k | 3024 |
| 8k | 6048 |
| 16k | 12096 |
| 32k | 24192 |

Number of Sub-carriers Adapted from DVB-T/H

Thus in one example, the number of sub-carriers for the 1 k mode is seven hundred and fifty six. For the DVB-T2 system, the number of sub-carriers per OFDM symbol can vary depending upon the number of pilot and other reserved carriers. Thus, in DVB-T2, unlike in DVB-T, the number of sub-carriers for carrying data is not fixed. Broadcasters can select one of the operating modes from 1 k, 2 k, 4 k, 8 k, 16 k, 32 k each providing a range of sub-carriers for data per OFDM symbol, the maximum available for each of these modes being 1024, 2048, 4096, 8192, 16384, 32768 respectively. In DVB-T2 a physical layer frame is composed of many OFDM symbols. Typically the frame starts with one or more preamble or P2 OFDM symbols, which are then followed by a number payload carrying OFDM symbols. The end of the physical layer frame is marked by a frame closing symbols. For each operating mode, the number of sub-carriers may be different for each type of symbol. Furthermore, this may vary for each according to whether bandwidth extension is selected, whether tone reservation is enabled and according to which pilot sub-carrier pattern has been selected. As such a generalisation to a specific number of sub-carriers per OFDM symbol is difficult. However, the frequency interleaver for each mode can interleave any symbol whose number of sub-carriers is smaller than or the same as the maximum available number of sub-carriers for the given mode. For example, in the 1 k mode, the interleaver would work for symbols with the number of sub-carriers being less than or equal to 1024 and for 16 k mode, with the number of sub-carriers being less than or equal to 16384.

The sequence of data cells to be carried in each COFDM symbol is then passed to the symbol interleaver 33. The COFDM symbol is then generated by a COFDM symbol builder block 37 which introduces pilot and synchronising signals fed from a pilot and embedded signal former 36. An OFDM modulator 38 then forms the OFDM symbol in the time domain which is fed to a guard insertion processor 40 for generating a guard interval between symbols, and then to a digital to analogue convertor 42 and finally to an RF amplifier within an RF front end 44 for eventual broadcast by the COFDM transmitter from an antenna 46.

Providing a 1 k Mode

To create a new 1K mode, several elements are to be defined, one of which is the 1K symbol interleaver 33. The bit to constellation mapper 28, symbol interleaver 33 and the frame builder 32 are shown in more detail in FIG. 2.

As explained above, the present invention provides a facility for providing a quasi-optimal mapping of the data symbols onto the OFDM sub-carrier signals. According to the example technique the symbol interleaver is provided to effect the optimal mapping of input data symbols onto COFDM sub-carrier signals in accordance with a permutation code and generator polynomial, which has been verified by simulation analysis.

Figure 2:
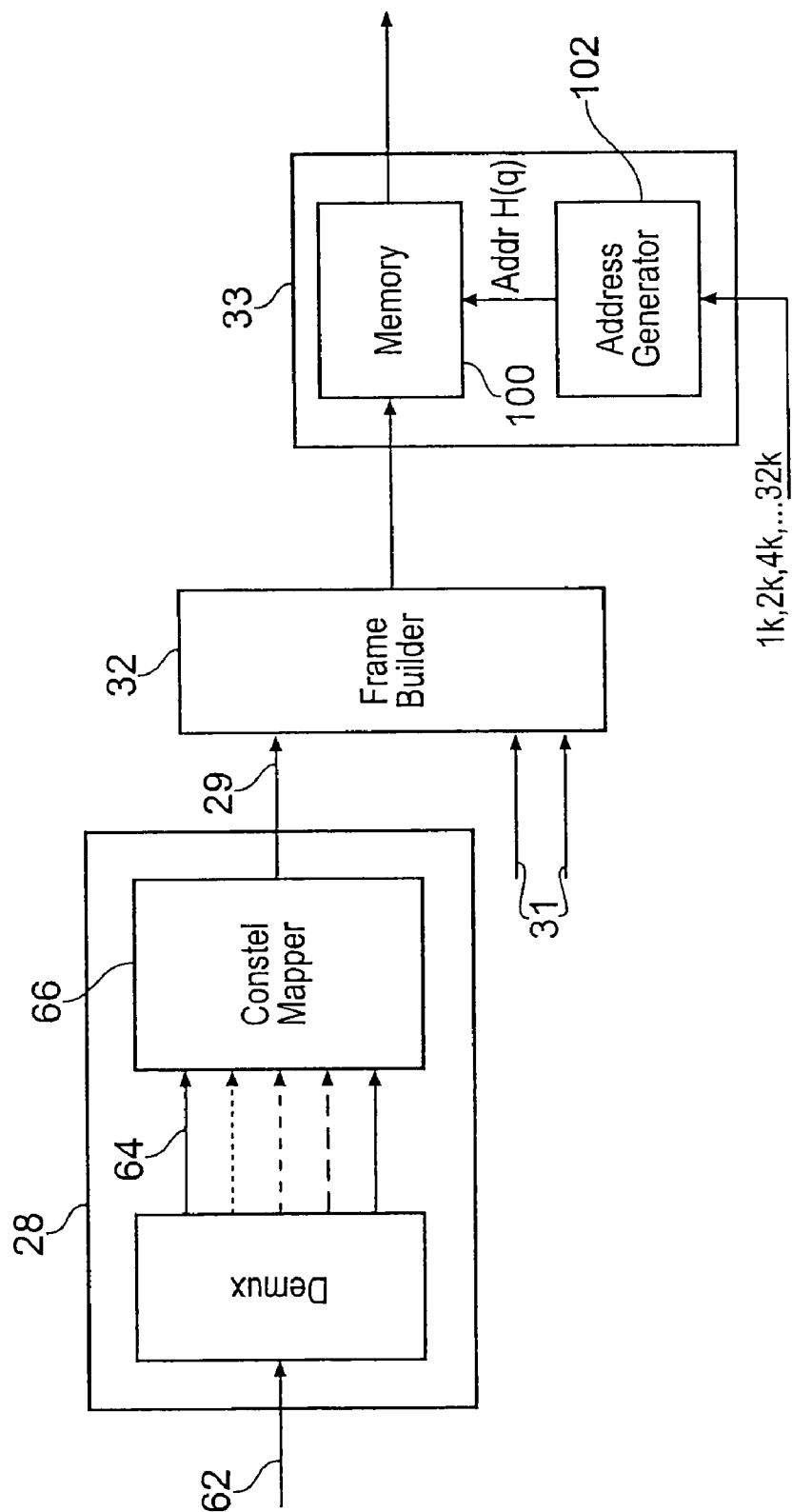
FIG. 2 is a schematic block diagram of parts of the transmitter shown in FIG. 1 in which a symbol mapper and a frame builder illustrate the operation of an interleaver.

As shown in FIG. 2 a more detailed example illustration of the bit to symbol constellation mapper 28 and the frame builder 32 is provided to illustrate an example embodiment of the present technique. Data bits received from the bit interleaver 26 via a channel 62 are grouped into sets of bits to be mapped onto a data cell, in accordance with a number of bits per symbol provided by the modulation scheme. The groups of bits, which forms a data word, are fed in parallel via data channels 64 the a mapping processor 66. The mapping processor 66 then selects one of the data symbols, in accordance with a pre-assigned mapping. The constellation point, is represented by a real and an imaginary component that is provided to the output channel 29 as one of a set of inputs to the frame builder 32.

The frame builder 32 receives the data cells from the bit to constellation mapper 28 through channel 29, together with data cells from the other channels 31. After building a frame of many COFDM cell sequences, the cells of each COFDM symbol are then written into an interleaver memory 100 and read out of the interleaver memory 100 in accordance with write addresses and read addresses generated by an address generator 102. According to the write-in and read-out order, interleaving of the data cells is achieved, by generating appropriate addresses. The operation of the address generator 102 and the interleaver memory 100 will be described in more detail shortly with reference to FIGS. 3, 4 and 5. The interleaved data cells are then combined with pilot and synchronisation symbols received from the pilot and embedded signalling former 36 into an OFDM symbol builder 37, to form the COFDM symbol, which is fed to the OFDM modulator 38 as explained above.

Interleaver

Figure 3:
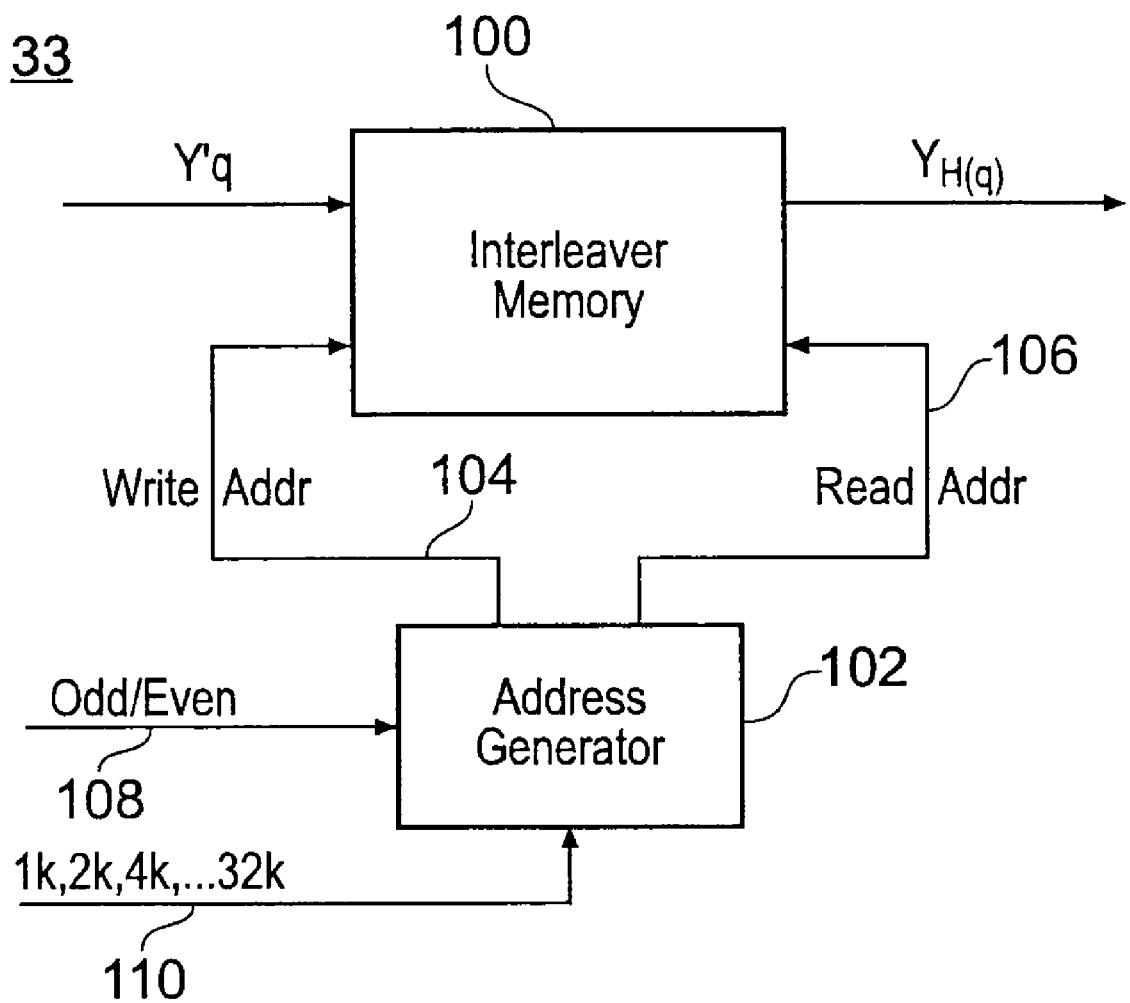
FIG. 3 is a schematic block diagram of the symbol interleaver shown in FIG. 2.

FIG. 3 provides an example of parts of the symbol interleaver 33, which illustrates the present technique for interleaving symbols. In FIG. 3 the input data cells from the frame builder 32 are written into the interleaver memory 100. The data cells are written into the interleaver memory 100 according to a write address fed from the address generator 102 on channel 104, and read out from the interleaver memory 100 according to a read address fed from the address generator 102 on a channel 106. The address generator 102 generates the write address and the read address as explained below, depending on whether the COFDM symbol is odd or even, which is identified from a signal fed from a channel 108, and depending on a selected mode, which is identified from a signal fed from a channel 110. As explained, the mode can be one of a 1 k mode, 2 k mode, 4 k mode, 8 k mode, 16 k mode or a 32 k mode. As explained below, the write address and the read address are generated differently for odd and even symbols as explained with reference to FIG. 4, which provides an example implementation of the interleaver memory 100.

Figure 4:
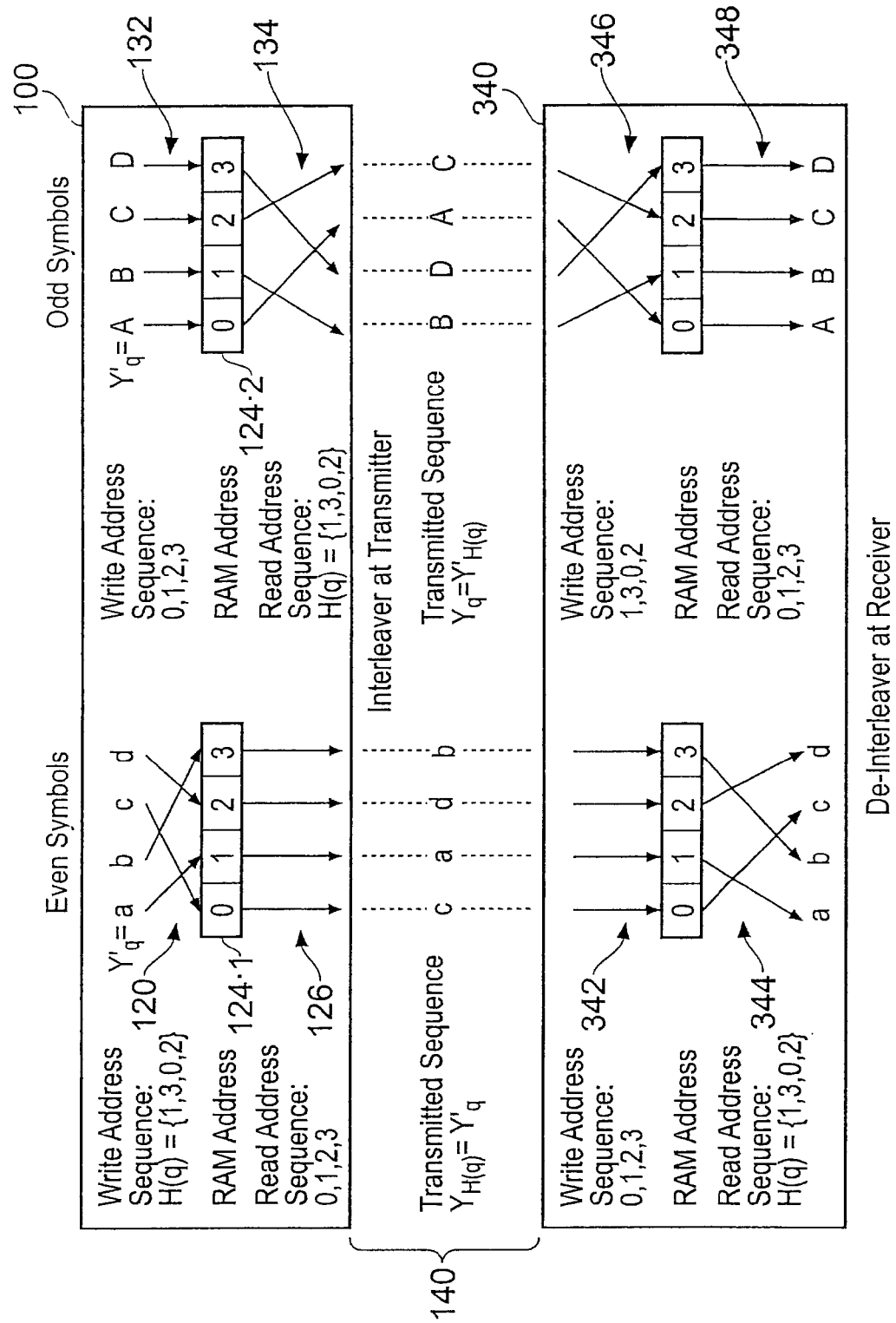
FIG. 4 is a schematic block diagram of an interleaver memory shown in FIG. 3 and the corresponding symbol de-interleaver in the receiver.

In the example shown in FIG. 4, the interleaver memory is shown to comprise an upper part 100 illustrating the operation of the interleaver memory in the transmitter and a lower part 340, which illustrates the operation of the de-interleaver memory in the receiver. The interleaver 100 and the de-interleaver 340 are shown together in FIG. 4 in order to facilitate understanding of their operation. As shown in FIG. 4 a representation of the communication between the interleaver 100 and the de-interleaver 340 via other devices and via a transmission channel has been simplified and represented as a section 140 between the interleaver 100 and the de-interleaver 340. The operation of the interleaver 100 is described in the following paragraphs:

Although FIG. 4 provides an illustration of only four input data cells onto an example of four sub-carrier signals of a COFDM symbol, it will be appreciated that the technique illustrated in FIG. 4 can be extended to a larger number of sub-carriers such as 756 for the 1 k mode 1512 for the 2 k mode, 3024 for the 4 k mode and 6048 for the 8 k mode, 12096 for the 16 k mode and 24192 for the 32 k mode.

The input and output addressing of the interleaver memory 100 shown in FIG. 4 is shown for odd and even symbols. For an even COFDM symbol the data cells are taken from the input channel and written into the interleaver memory 124.1 in accordance with a sequence of addresses 120 generated for each COFDM symbol by the address generator 102. The write addresses are applied for the even symbol so that as illustrated interleaving is effected by the shuffling of the write-in addresses. Therefore, for each interleaved symbol y(h(q))=y'(q).

For odd symbols the same interleaver memory 124.2 is used. However, as shown in FIG. 4 for the odd symbol the write-in order 132 is in the same address sequence used to read out the previous even symbol 126. This feature allows the odd and even symbol interleaver implementations to only use one interleaver memory 100 provided the read-out operation for a given address is performed before the write-in operation. The data cells written into the interleaver memory 124.2 during odd symbols are then read out in a sequence 134 generated by the address generator 102 for the next even COFDM symbol and so on. Thus only one address is generated per symbol, with the read-in and write-out for the odd/even COFDM symbol being performed contemporaneously.

In summary, as represented in FIG. 4, once the set of addresses H(q) has been calculated for all active sub-carriers, the input vector $Y'=(y'_0, y'_1, y'_2, \ldots y'_{Nmax-1})$ is processed to produce the interleaved vector $Y=(y_0, y_1, y_2, \ldots y_{Nmax-1})$ defined by:

$y_{H(q)}=y'_q$ for even symbols for $q=0, \ldots, N_{max}-1$ $y_q=y'_{H(q)}$ for odd symbols for $q=0, \ldots, N_{max}-1$ In other words, for even OFDM symbols the input words are written in a permutated way into a memory and read back in a sequential way, whereas for odd symbols, they are written sequentially and read back permutated. In the above case, the permutation H(q) is defined by the following table:

TABLE 1

| permutation for simple case where Nmax = 4 | | | |
|---|---|---|---|
| q | | | |
| 0 | 1 | 2 | 3 |
| H(q) 1 | 3 | 0 | 2 |

As shown in FIG. 4, the de-interleaver 340 operates to reverse the interleaving applied by the interleaver 100, by applying the same set of addresses as generated by an equivalent address generator, but applying the write-in and read-out addresses in reverse. As such, for even symbols, the write-in addresses 342 are in sequential order, whereas the read out address 344 are provided by the address generator. Correspondingly, for the odd symbols, the write-in order 346 is determined from the set of addresses generated by the address generator, whereas read out 348 is in sequential order.

Address Generation for the 1 k Mode

Figure 5:
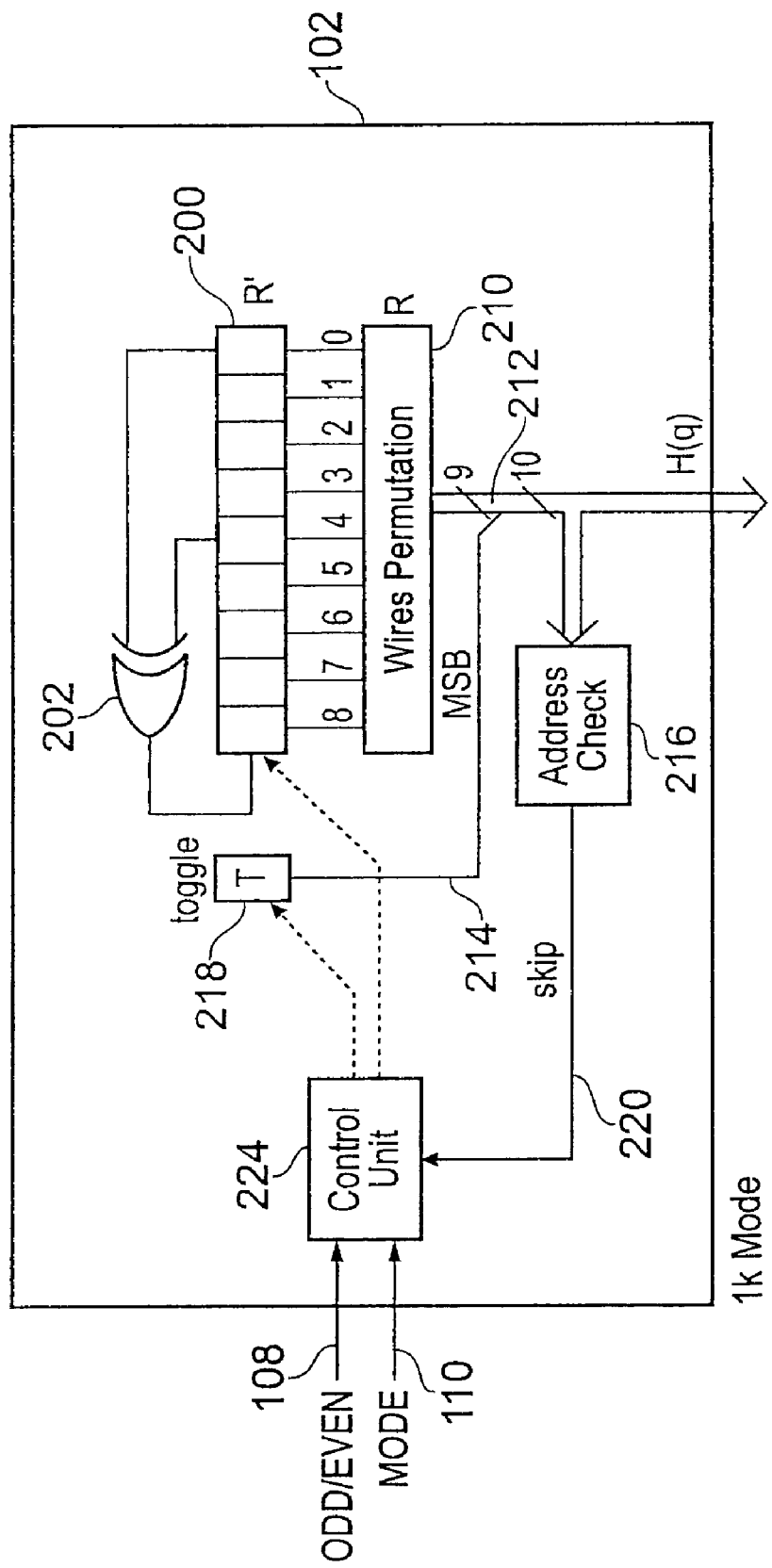
FIG. 5 is a schematic block diagram of an address generator shown in FIG. 3 for the 1 k mode.

A schematic block diagram of the algorithm used to generate the permutation function H(q) is represented in FIG. 5 for the 1K mode.

An implementation of the address generator 102 for the 1 k mode is shown in FIG. 5. In FIG. 5 a linear feed back shift register is formed by nine register stages 200 and a xor-gate 202 which is connected to the stages of the shift register 200 in accordance with a generator polynomial. Therefore, in accordance with the content of the shift register 200 a next bit of the shift register is provided from the output of the xor-gate 202 by xoring the content of shift register R[0] and register stage R[4] according to the generator polynomial:

$R'_i[8]=R'_{i-1}[0] \oplus R'_{i-1}[4]$

According to the generator polynomial a pseudo random bit sequence is generated from the content of the shift register 200. However, in order to generate an address for the 1 k mode as illustrated, a permutation circuit 210 is provided which effectively permutes the order of the bits within the shift register 200 from an order $R'_i[n]$ to an order $R_i[n]$ at the output of the permutation circuit 210. Nine bits from the output of the permutation circuit 210 are then fed on a connecting channel 212 to which is added a most significant bit via a channel 214 which is provided by a toggle circuit 218. A ten bit address is therefore generated on channel 212. However, in order to ensure the authenticity of an address, an address check circuit 216 analyses the generated address to determine whether it exceeds a predetermined maximum value. The predetermined maximum value may correspond to the maximum number of sub-carrier signals, which are available for data symbols within the COFDM symbol, available for the mode which is being used. However, the interleaver for the 1 k mode may also be used for other modes, so that the address generator 102 may also be used for the 2 k mode, 4 k mode, 8 k mode, 16 k mode and the 32 k mode, by adjusting accordingly the number of the maximum valid address.

If the generated address exceeds the predetermined maximum value then a control signal is generated by the address check unit 216 and fed via a connecting channel 220 to a control unit 224. If the generated address exceeds the predetermined maximum value then this address is rejected and a new address regenerated for the particular symbol.

For the 1 k mode, an $(N_r-1)$ bit word $R'_i$ is defined, with $N_r=\log_2 M_{max}$, where $M_{max}=1024$ using a LFSR (Linear Feedback Shift Register).

The polynomial used to generate this sequence is:

1K mode: $R'_i[8]=R'_{i-1}[0] \oplus R'_{i-1}[4]$ where i varies from 0 to $M_{max}-1$ Once one $R'_i$, word has been generated, the $R'_i$, word goes through a permutation to produce another $(N_r-1)$ bit word called $R_i$. $R_i$ is derived from $R'_i$ by the bit permutations given as follows:

| $R'_i$ bit positions | 8 | 7 | 6 | 5 | 4 | 3 | 2 | 1 | 0 |
|---|---|---|---|---|---|---|---|---|---|
| $R_i$ bit positions | 4 | 3 | 2 | 1 | 0 | 5 | 6 | 7 | 8 |

Bit permutation for the 1K mode

As an example, this means that for the mode 1K, the bit number 8 of $R'_i$ is sent into bit position number 4 of $R_i$.

The address $H(q)$ is then derived from $R_i$ through the following equation:

$$H(q) = (i \bmod 2) \cdot 2^{N_r-1} + \sum_{j=0}^{N_r-2} R_i(j) \cdot 2^j$$

The $(i \bmod 2) \cdot 2^{N_r-1}$ part of the above equation is represented in FIG. 5 by the toggle block T 218.

An address check is then performed on $H(q)$ to verify that the generated address is within the range of acceptable addresses: if $(H(q) < N_{max})$, where $N_{max}=756$ in the 1K mode for example, then the address is valid. If the address is not valid, the control unit is informed and it will try to generate a new $H(q)$ by incrementing the index i.

The role of the toggle block is to make sure that we do not generate an address exceeding $N_{max}$ twice in a row. In effect, if an exceeding value was generated, this means that the MSB (i.e. the toggle bit) of the address $H(q)$ was one. So the next value generated will have a MSB set to zero, insuring to produce a valid address.

The following equations sum up the overall behaviour and help to understand the loop structure of this algorithm:

$q = 0;$
$\text{for } (i = 0; i < M_{max}; i = i + 1)$ $$\left\{ \begin{array}{l} H(q) = (i \bmod 2) \cdot 2^{N_r-1} + \sum_{j=0}^{N_r-2} R_i(j) \cdot 2^j; \\ \text{if } (H(q) < N_{max}) \; q = q+1; \end{array} \right\}$$

As will be explained shortly, in one example of the address generator, the above mentioned permutation code is used for generating addresses for all OFDM symbols. In another example, the permutation codes may be changed between symbols, with the effect that a set of permutation codes are cycled through for successive OFMD symbols. To this end, the control lines 108, 110 providing an indication as to whether the OFDM symbol is odd or even and the current mode are used to select the permutation code. This example mode in which a plurality of permutation codes are cycled through is particularly appropriate for the example in which the odd interleaver only is used, which will be explained later. A signal indicating that a different permutation code should be used is provided via a control channel. In one example the possible permutation codes are pre-stored in the permutation code circuit 210. In another example, the control unit 224 supplies the new permutation code to be used for an OFDM symbol.

Analysis Supporting the Address Generator for the 1 k Mode

The selection of the polynomial generator and the permutation code explained above for the address generator 102 for the 1 k mode has been identified following simulation analysis of the relative performance of the interleaver. The relative performance of the interleaver has been evaluated using a relative ability of the interleaver to separate successive symbols or an "interleaving quality". As mentioned above, effectively the interleaving must perform for both odd and even symbols, in order to use a single interleaver memory. The relative measure of the interleaver quality is determined by defining a distance D (in number of sub-carriers). A criterion C is chosen to identify a number of sub-carriers that are at distance $\leq D$ at the output of the interleaver that were at distance $\leq D$ at the input of the interleaver, the number of sub-carriers for each distance D then being weighted with respect to the relative distance. The criterion C is evaluated for both odd and even COFDM symbols. Minimising C produces a superior quality interleaver.

$$C = \sum_{1}^{d=D} N_{even}(d)/d + \sum_{1}^{d=D} N_{odd}(d)/d$$

where: $N_{even}(d)$ and $N_{odd}(d)$ are number of sub-carriers in an even and odd symbol respectively at the output of the interleaver that remain within d sub-carrier spacing of each other.

Figure 6A:
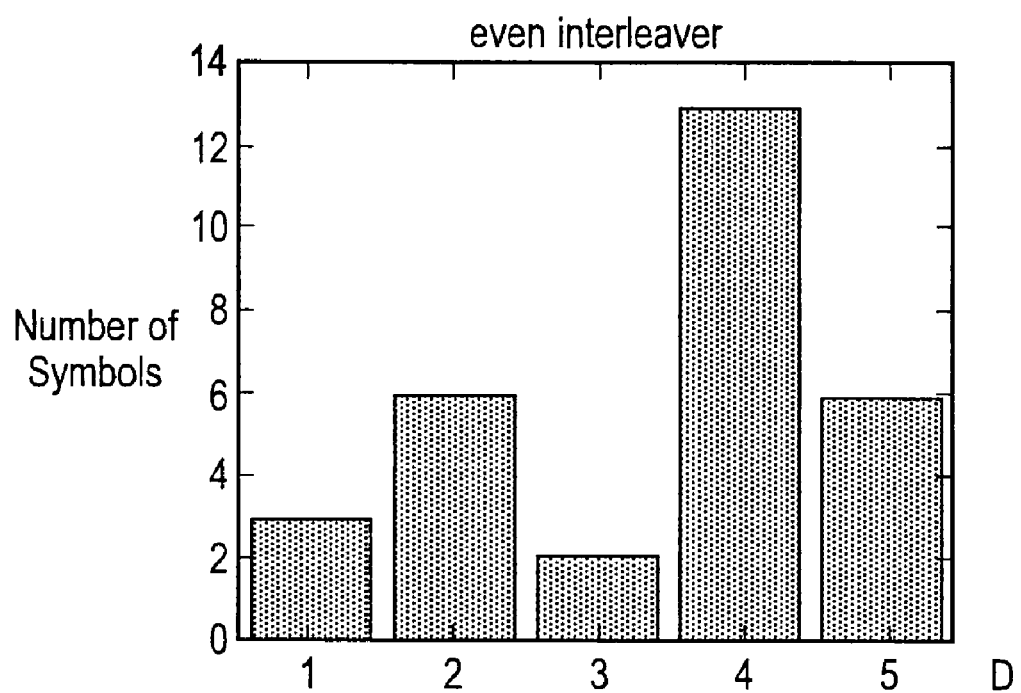
Figure 6B:
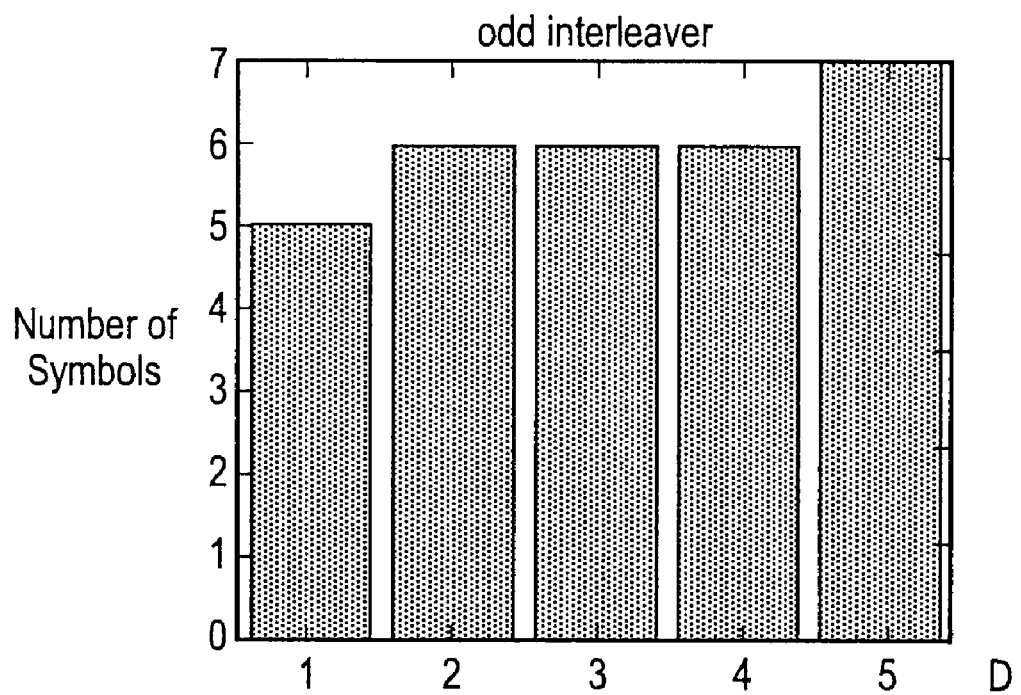

Analysis of the interleaver identified above for the 1 k mode for a value of D=5 is shown in FIG. 6(a) for the even COFDM symbols and in FIG. 6(b) for the odd COFDM symbol. According to the above analysis, the value of C for the permutation code identified above for the 1 k mode produced a value of C=24, that the weighted number of sub-carriers with symbols which are separated by five or less in the output according to the above equation was 24.

Figure 6C:
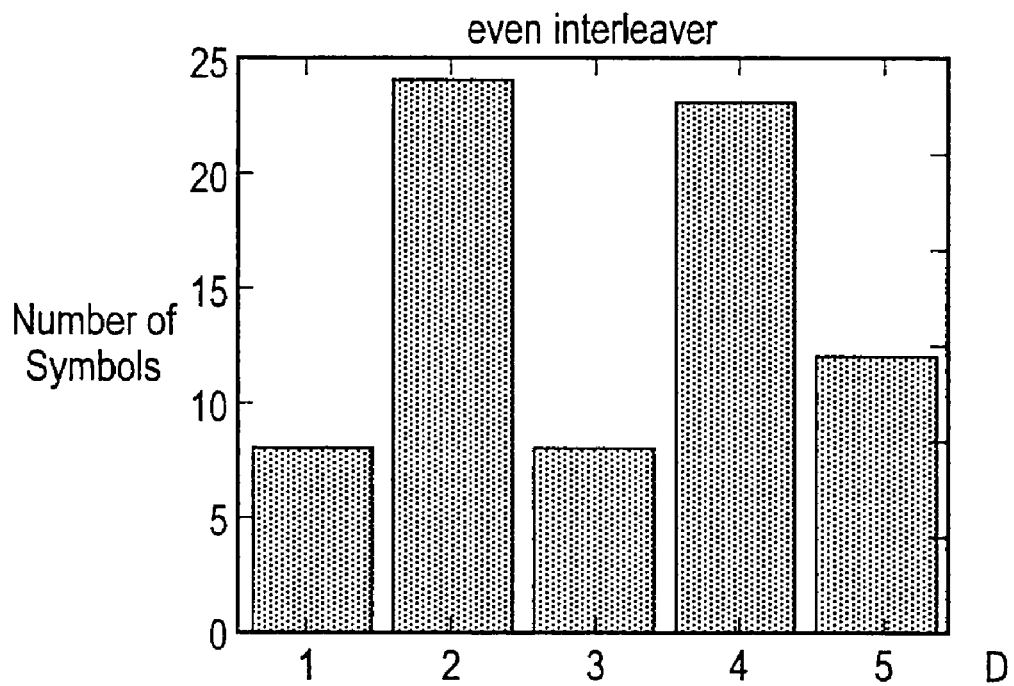
FIG. 6(c) is a diagram illustrating comparative results for an address generator using a different permutation code for even and FIG. 6(d) is a corresponding diagram for odd symbols.
Figure 6D:
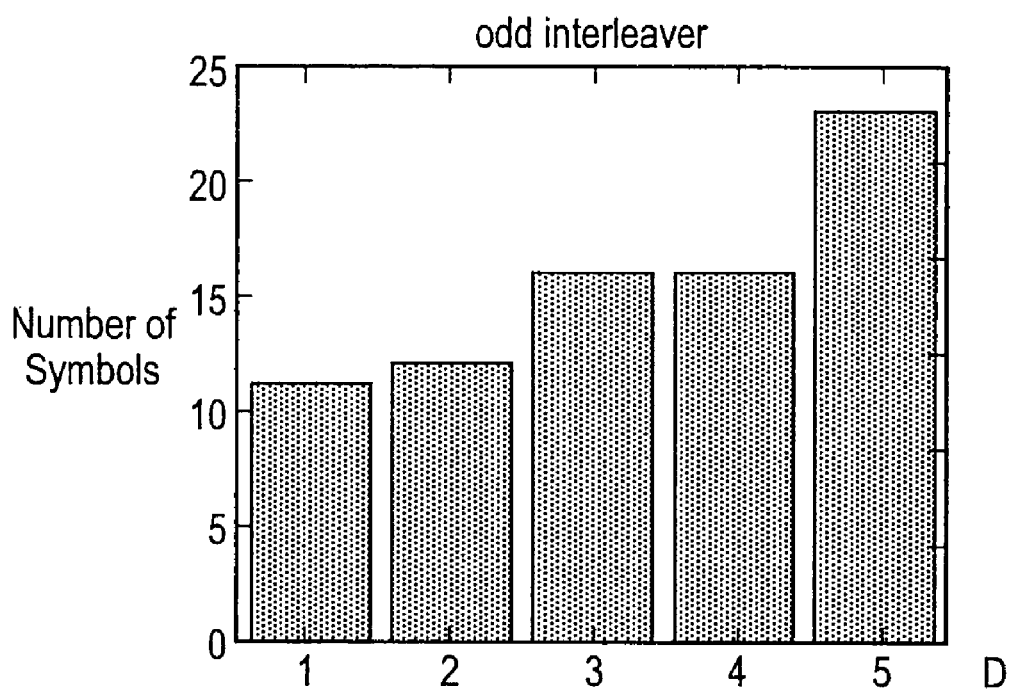

A corresponding analysis is provided for an alternative permutation code for even COFDM symbols in FIG. 6(c) for odd COFDM symbols in FIG. 6(d). As can be seen in comparison to the results illustrated in FIGS. 6(a) and 6(b), there are more components present which represent symbols separated by small distances such as D=1, and D=2, when compared with the results shown in FIGS. 6(a) and 6(b), illustrating that the permutation code identified above for the 1 k mode symbol interleaver produces a superior quality interleaver.

Alternative Permutation Codes

The following ten alternative possible codes ([n]$R_i$ bit positions, where n=1 to 10) have been found to provide a symbol interleaver with a good quality as determined by the criterion C identified above.

| $R'_i$ bit positions | 8 | 7 | 6 | 5 | 4 | 3 | 2 | 1 | 0 |
|---|---|---|---|---|---|---|---|---|---|
| [1]$R_i$ bit positions | 5 | 3 | 2 | 1 | 0 | 6 | 7 | 4 | 8 |
| [2]$R_i$ bit positions | 4 | 3 | 2 | 1 | 0 | 6 | 7 | 5 | 8 |
| [3]$R_i$ bit positions | 4 | 3 | 2 | 1 | 0 | 5 | 7 | 6 | 8 |
| [4]$R_i$ bit positions | 3 | 2 | 1 | 5 | 0 | 6 | 4 | 7 | 8 |
| [5]$R_i$ bit positions | 4 | 2 | 3 | 0 | 1 | 7 | 5 | 8 | 6 |
| [6]$R_i$ bit positions | 4 | 2 | 3 | 0 | 1 | 5 | 7 | 8 | 6 |
| [7]$R_i$ bit positions | 4 | 2 | 3 | 0 | 1 | 5 | 6 | 8 | 7 |
| [8]$R_i$ bit positions | 3 | 2 | 5 | 0 | 1 | 4 | 7 | 8 | 6 |
| [9]$R_i$ bit positions | 4 | 2 | 3 | 0 | 1 | 5 | 7 | 8 | 6 |
| [10]$R_i$ bit positions | 4 | 3 | 2 | 1 | 0 | 5 | 6 | 7 | 8 |

Bit permutation for the 1K mode

Receiver

Figure 7:
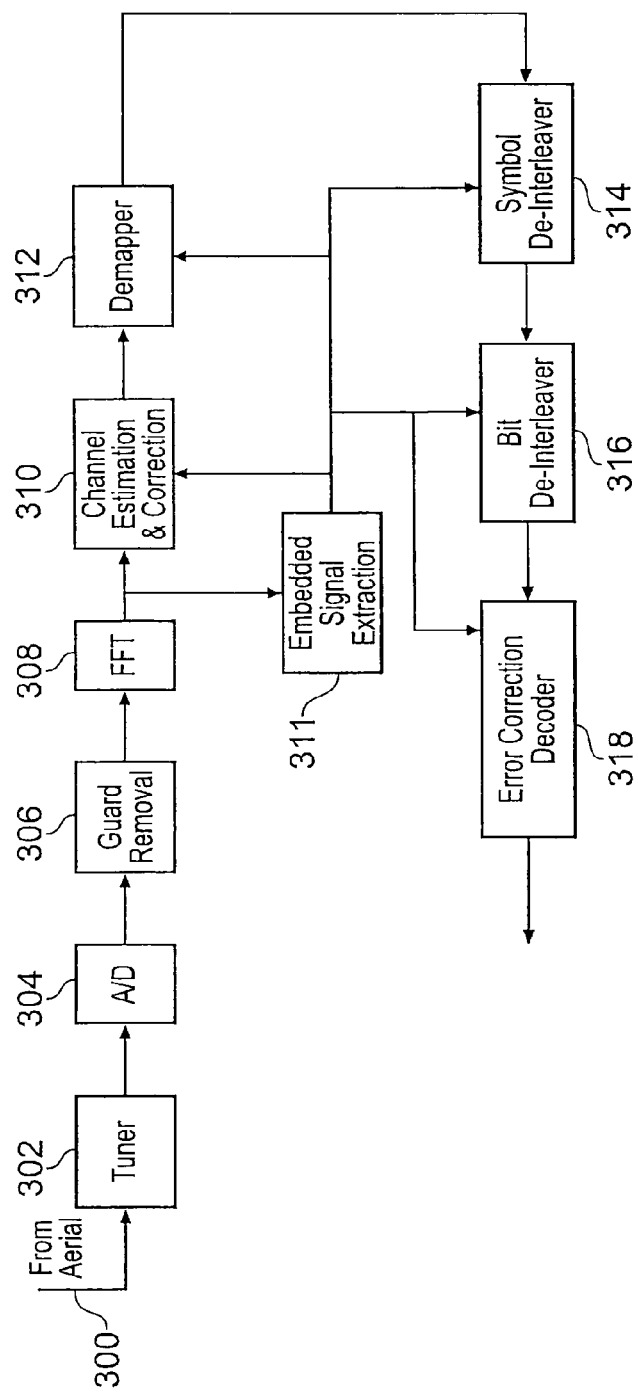
FIG. 7 is a schematic block diagram of a Coded OFDM receiver which may be used, for example, with the DVB-T2 standard.

FIG. 7 provides an example illustration of a receiver which may be used with the present technique. As shown in FIG. 7, a COFDM signal is received by an antenna 300 and detected by a tuner 302 and converted into a digital form by an analogue-to-digital converter 304. A guard interval removal processor 306 removes the guard interval from a received COFDM symbol, before the data is recovered from the COFDM symbol using a Fast Fourier Transform (FFT) processor 308 in combination with a channel estimator and correction 310 in co-operation with a embedded-signalling decoding unit 311, in accordance with known techniques. The demodulated data is recovered from a mapper 312 and fed to a symbol de-interleaver 314, which operates to effect the reverse mapping of the received data symbol to re-generate an output data stream with the data de-interleaved.

Figure 8:
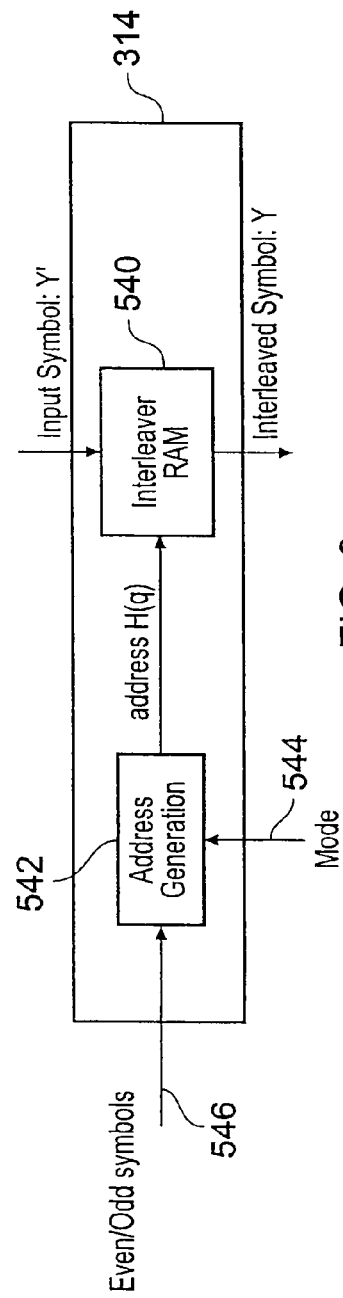
FIG. 8 is a schematic block diagram of a symbol de-interleaver which appears in FIG. 7.

The symbol de-interleaver 314 is formed from a data processing apparatus as shown in FIG. 8 with an interleaver memory 540 and an address generator 542. The interleaver memory is as shown in FIG. 4 and operates as already explained above to effect de-interleaving by utilising sets of addresses generated by the address generator 542. The address generator 542 is formed as shown in FIG. 8 and is arranged to generate corresponding addresses to map the data symbols recovered from each COFDM sub-carrier signals into an output data stream.

The remaining parts of the COFDM receiver shown in FIG. 7 including the Bit De-interleaver 316 are provided to effect error correction decoding 318 to correct errors and recover an estimate of the source data.

One advantage provided by the present technique for both the receiver and the transmitter is that a symbol interleaver and a symbol de-interleaver operating in the receivers and transmitters can be switched between the 1 k, 2 k, 4 k, 8 k, 16 k and the 32 k mode by changing the generator polynomials and the permutation order. Hence the address generator 542 shown in FIG. 8 includes an input 544, providing an indication of the mode as well as an input 546 indicating whether there are odd/even COFDM symbols. A flexible implementation is thereby provided because a symbol interleaver and de-interleaver can be formed as shown in FIGS. 3 and 8, with an address generator as illustrated in either of FIG. 5. The address generator can therefore be adapted to the different modes by changing to the generator polynomials and the permutation orders indicated for each of the modes. For example, this can be effected using a software change. Alternatively, in other embodiments, an embedded signal indicating the mode of the DVB-T2 transmission can be detected in the receiver in the embedded-signalling processing unit 311 and used to configure automatically the symbol de-interleaver in accordance with the detected mode.

Optimal Use of Odd Interleavers

As shown in FIG. 4, two symbol interleaving processes, one for even COFDM symbols and one for odd COFDM symbols allows the amount of memory used during interleaving to be reduced. In the example shown in FIG. 4, the write in order for the odd symbol is the same as the read out order for the even symbol therefore, while an odd symbol is being read from the memory, an even symbol can be written to the location just read from; subsequently, when that even symbol is read from the memory, the following odd symbol can be written to the location just read from.

Figure 9A:
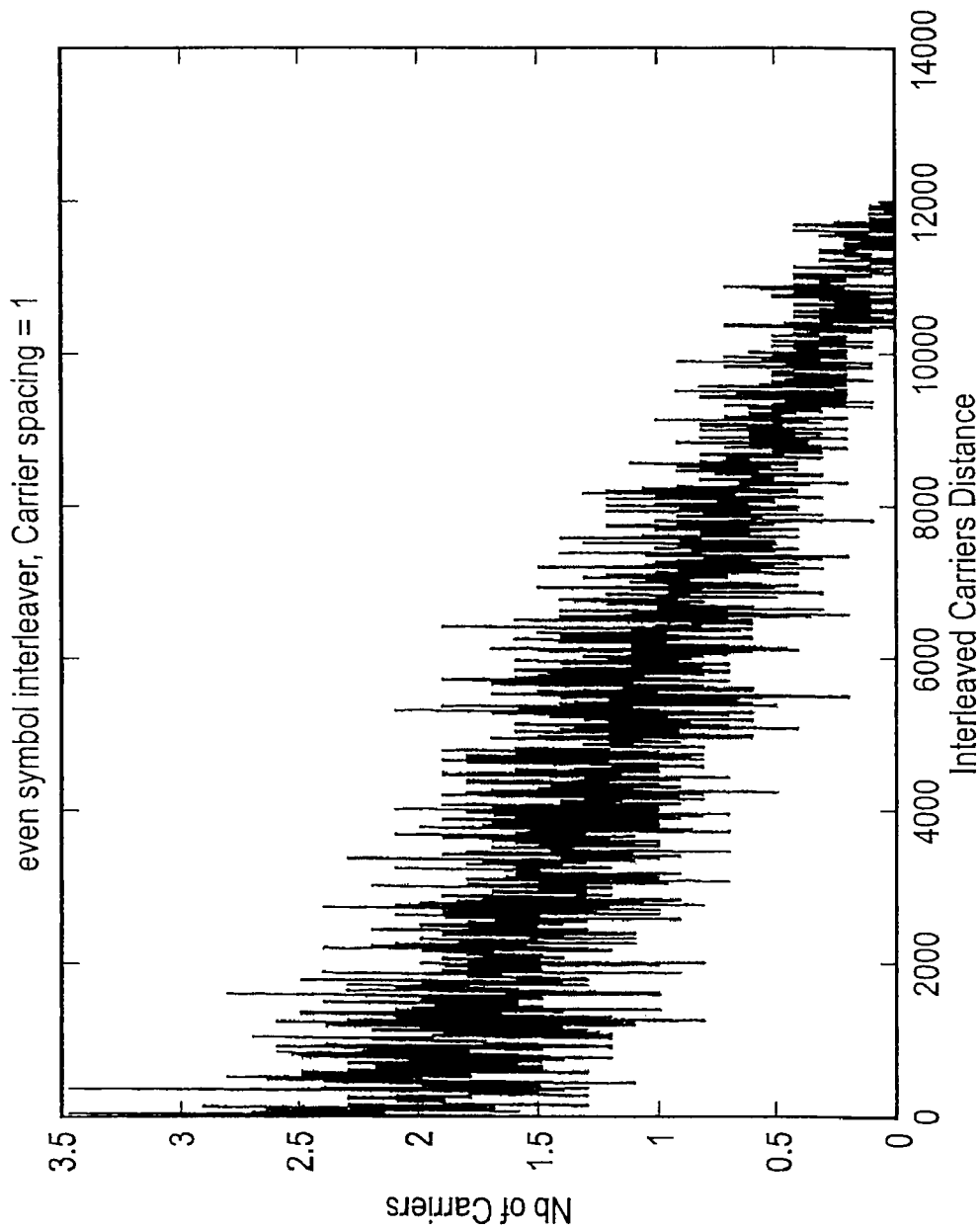
FIG. 9(a) is diagram illustrating results for an interleaver for even OFDM symbols and FIG. 9(b) is a diagram illustrating results for odd OFDM symbols.
Figure 9B:
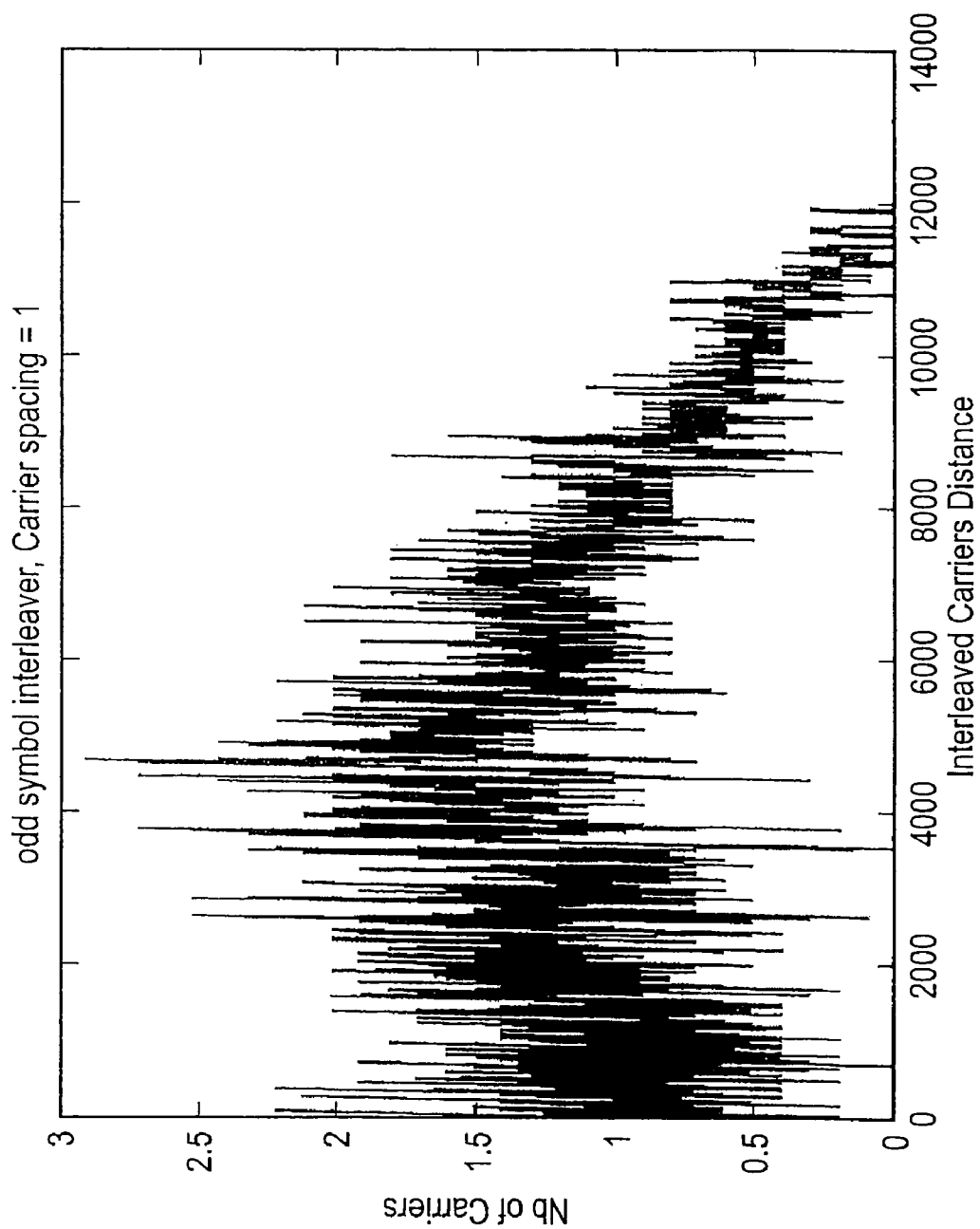

As mentioned above, during an experimental analysis of the performance of the interleavers (using criterion C as defined above) and for example shown in FIG. 9(a) and FIG. 9(b) it has been discovered that the interleaving schemes designed for the 2 k and 8 k symbol interleavers for DVB-T and the 4 k symbol interleaver for DVB-H work better for odd symbols than even symbols. Thus from performance evaluation results of the interleavers, for example, as illustrated by FIGS. 9(a) and 9(b) have revealed that the odd interleavers work better than the even interleavers. This can be seen by comparing FIG. 9(a) which shows results for an interleaver for even symbols and FIG. 9(b) illustrating results for odd symbols: it can be seen that the average distance at the interleaver output of sub-carriers that were adjacent at the interleaver input is greater for an interleaver for odd symbols than an interleaver for even symbols.

As will be understood, the amount of interleaver memory required to implement a symbol interleaver is dependent on the number of data symbols to be mapped onto the COFDM carrier symbols. Thus a 16 k mode symbol interleaver requires half the memory required to implement a 32 k mode symbol interleaver and similarly, the amount of memory required to implement an 8 k symbol interleaver is half that required to implement a 16 k interleaver. Therefore a transmitter or receiver which is arranged to implement a symbol interleaver of a mode, which sets the maximum number of data symbols which can be carried per OFDM symbol, then that receiver or transmitter will include sufficient memory to implement two odd interleaving processes for any other mode, which provides half or smaller than half the number of sub-carriers per OFDM symbol in that given maximum mode. For example a receiver or transmitter including a 32K interleaver will have enough memory to accommodate two 16K odd interleaving processes each with their own 16K memory.

Therefore, in order to exploit the better performance of the odd interleaving processes, a symbol interleaver capable of accommodating multiple modulation modes can be arranged so that only an odd symbol interleaving process is used if in a mode which comprises half or less than half of the number of sub-carriers in a maximum mode, which represents the maximum number of sub-carriers per OFDM symbol. This maximum mode therefore sets the maximum memory size. For example, in a transmitter/receiver capable of the 32K mode, when operating in a mode with fewer carriers (i.e. 16K, 8K, 4K or 1K) then rather than employing separate odd and even symbol interleaving processes, two odd interleavers would be used.

Figure 10:
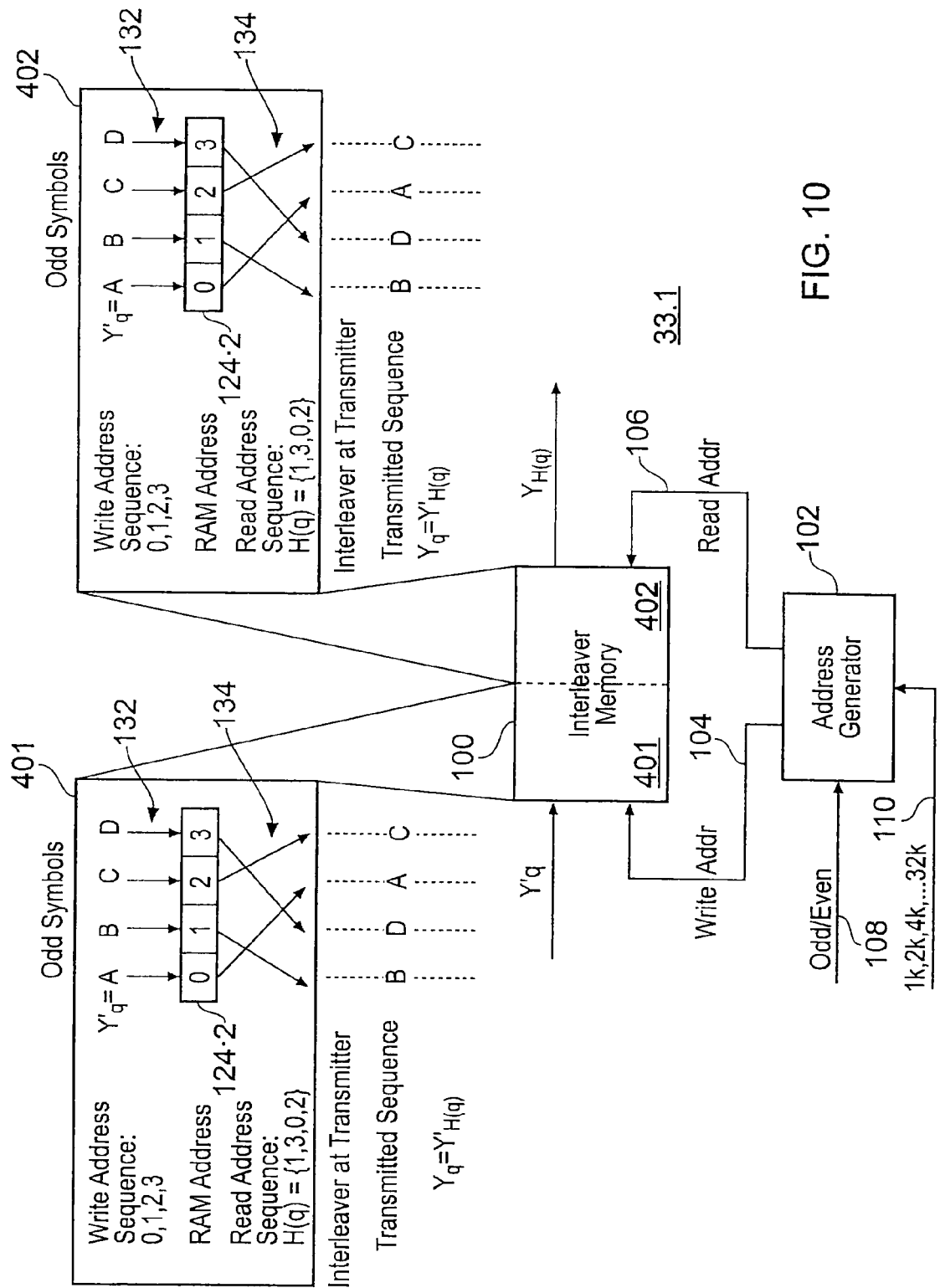
FIG. 10 provides a schematic block diagram of the symbol interleaver shown in FIG. 3, illustrating an operating mode in which interleaving is performed in accordance with an odd interleaving mode only.

An illustration of an adaptation of the symbol interleaver 33 which is shown in FIG. 3 when interleaving input data symbols onto the sub-carriers of OFDM symbols in the odd interleaving mode only is shown in FIG. 10. The symbol interleaver 33.1 corresponds exactly to the symbol interleaver 33 as shown in FIG. 3, except that the address generator 102 is adapted to perform the odd interleaving process only. For the example shown in FIG. 10, the symbol interleaver 33.1 is operating in a mode where the number of data symbols which can be carried per OFDM symbol is less than half of the maximum number which can be carried by an OFDM symbol in an operating mode with the largest number of sub-carriers per OFDM symbol. As such, the symbol interleaver 33.1 has been arranged to partition the interleaver memory 100. For the present illustration shown in FIG. 10 the interleaver memory then 100 is divided into two parts 401, 402. As an illustration of the symbol interleaver 33.1 operating in a mode in which data symbols are mapped onto the OFDM symbols using the odd interleaving process, FIG. 10 provides an expanded view of each half of the interleaver memory 401, 402. The expanded provides an illustration of the odd interleaving mode as represented for the transmitter side for four symbols A, B, C, D reproduced from FIG. 4. Thus as shown in FIG. 10, for successive sets of first and second data symbols, the data symbols are written into the interleaver memory 401, 402 in a sequential order and read out in accordance with addresses generated by the address generator 102 in a permuted order in accordance with the addresses generated by the address generator as previously explained. Thus as illustrated in FIG. 10, since an odd interleaving process is being performed for successive sets of first and second sets of data symbols, the interleaver memory must be partitioned into two parts. Symbols from a first set of data symbols are written into a first half of the interleaver memory 401, and symbols from a second set of data symbols are written into a second part of the interleaver memory 402, because the symbol interleaver is no longer able to reuse the same parts of the symbol interleaver memory as can be accommodated when operating in an odd and even mode of interleaving.

Figure 11:
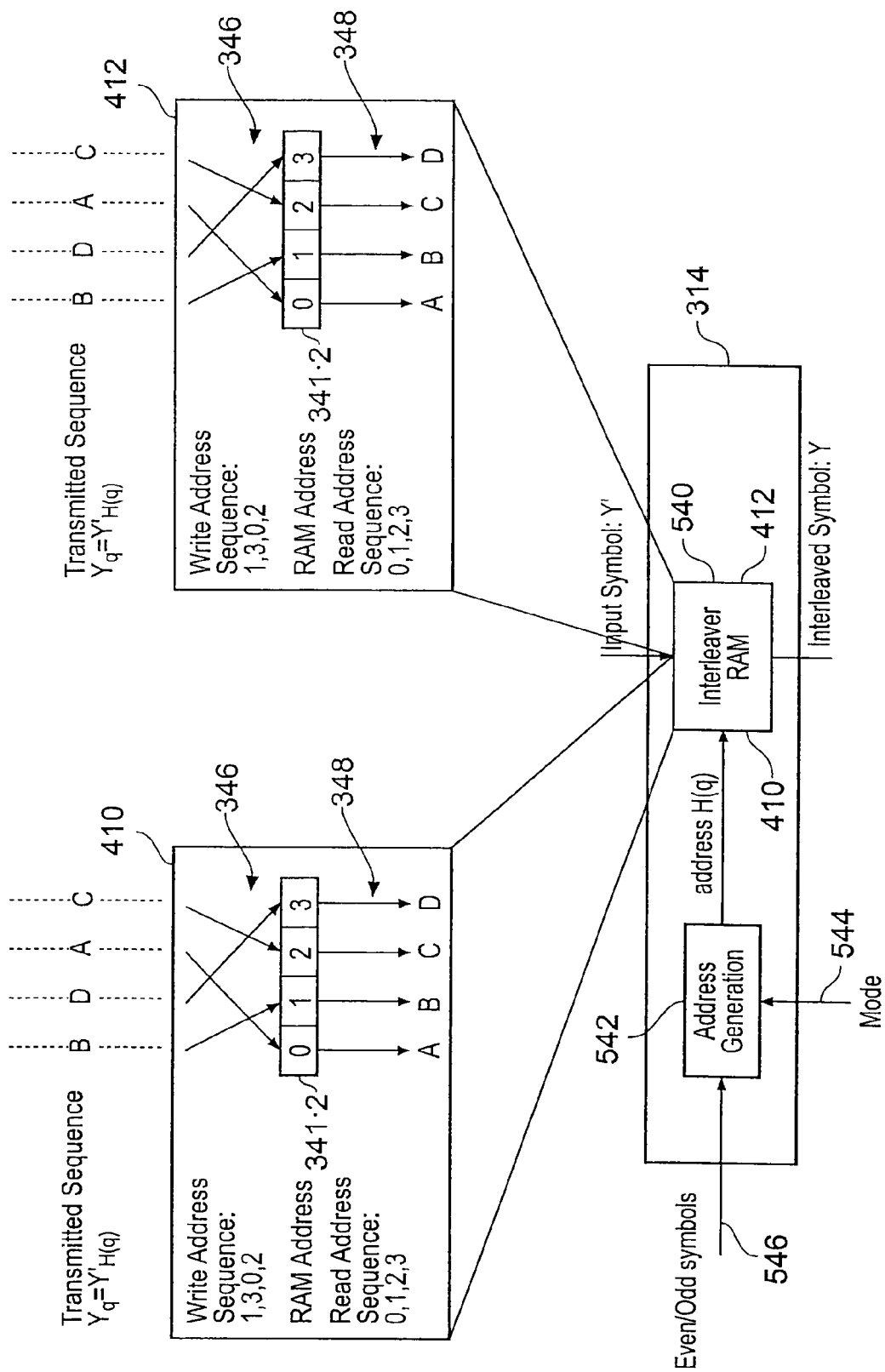
FIG. 11 provides a schematic block diagram of the symbol de-interleaver shown in FIG. 8, illustrating the operating mode in which interleaving is performed in accordance with the odd interleaving mode only.

A corresponding example of the interleaver in the receiver, which appears in FIG. 8 but adapted to operate with an odd interleaving process only is shown in FIG. 11. As shown in FIG. 11 the interleaver memory 540 is divided into two halves 410, 412 and the address generator 542 is adapted to write data symbols into the interleaver memory and read data symbols from the interleaver memory into respective parts of the memory 410, 412 for successive sets of data symbols to implement an odd interleaving process only. Therefore, in correspondence with representation shown in FIG. 10, FIG. 11 shows the mapping of the interleaving process which is performed at the receiver and illustrated in FIG. 4 as an expanded view operating for both the first and second halves of the interleaving memory 410, 412. Thus a first set of data symbols are written into a first part of the interleaver memory 410 in a permuted order defined in accordance with the addresses generated by the address generator 542 as illustrated by the order of writing in the data symbols which provides a write sequence of 1, 3, 0, 2. As illustrated the data symbols are then read out of the first part of the interleaver memory 410 in a sequential order thus recovering the original sequence A, B, C, D.

Correspondingly, a second subsequent set of data symbols which are recovered from a successive OFDM symbol are written into the second half of the interleaver memory 412 in accordance with the addresses generated by the address generator 542 in a permuted order and read out into the output data stream in a sequential order.

In one example the addresses generated for a first set of data symbols to write into the first half of the interleaver memory 410 can be reused to write a second subsequent set of data symbols into the interleaver memory 412. Correspondingly, the transmitter may also reuse addresses generated for one half of the interleaver for a first set of data symbols for reading out a second set of data symbols which have been written into the second half of the memory in sequential order.

Odd Interleaver With Offset

The performance of an interleaver, which uses two odd interleavers could be further improved by using a sequence of odd only interleavers rather than a single odd only interleaver, so that any bit of data input to the interleave does not always modulate the same carrier in the OFDM symbol.

A sequence of odd only interleavers could be realised by either:

adding an offset to the interleaver address modulo the number of data carriers, or using a sequence of permutations in the interleaver Adding an Offset Adding an offset to the interleaver address modulo the number of data carriers effectively shifts and wraps-round the OFDM symbol so that any bit of data input to the interleaver does not always modulate the same carrier in the OFDM symbol. Thus the address generator, could optionally include an offset generator, which generates an offset in an address generated by the address generator on the output channel H(q).

The offset would change each symbol. For example, this offset could provide be a cyclic sequence. This cyclic sequence could be, for example, of length 4 and could consist of, for example, prime numbers. For example, such a sequence could be:

0,41,97,157

Furthermore, the offset may be a random sequence, which may be generated by another address generator from a similar OFDM symbol interleaver or may be generated by some other means.

Using a Sequence of Permutations

As shown in FIG. 5, a control line extends from the control unit of the address generator to the permutation circuit. As mentioned above, in one example the address generator can apply a different permutation code from a set of permutation codes for successive OFDM symbols. Using a sequence of permutations in the interleaver address generator reduces a likelihood that any bit of data input to the interleaver does not always modulate the same sub-carrier in the OFDM symbol.

For example, this could be a cyclic sequence, so that a different permutation code in a set of permutation codes in a sequence is used for successive OFDM symbols and then repeated. This cyclic sequence could be, for example, of length two or four. For the example of the 16K symbol interleaver a sequence of two permutation codes which are cycled through per OFDM symbol could be for example:

8 4 3 2 0 1 11 5 12 10 6 7 9
7 9 5 3 11 1 4 0 2 12 10 8 6 whereas a sequence of four permutation codes could be:

```
8 4 3 2 0 11 1 5 12 10 6 7 9
7 9 5 3 11 1 4 0 2 12 10 8 6
6 11 7 5 2 3 0 1 10 8 12 9 4
5 12 9 0 3 10 2 4 6 7 8 11 1
```

The switching of one permutation code to another could be effected in response to a change in the Odd/Even signal indicated on the control channel 108. In response the control unit 224 changes the permutation code in the permutation code circuit 210 via the control line.

For the example of a 1 k symbol interleaver, two permutation codes could be:

```
4 3 2 1 0 5 6 7 8
3 2 5 0 1 4 7 8 6
``` whereas four permutation codes could be:

```
4 3 2 1 0 5 6 7 8
3 2 5 0 1 4 7 8 6
7 5 3 8 2 6 1 4 0
1 6 8 2 5 3 4 0 7
```

Other combinations of sequences may be possible for 2 k, 4 k and 8 k carrier modes or indeed 0.5 k carrier mode. For example, the following permutation codes for each of the 0.5 k, 2 k, 4 k and 8 k provide good de-correlation of symbols and can be used cyclically to generate the offset to the address generated by an address generator for each of the respective modes:

```
2k Mode:

0 7 5 1 8 2 6 9 3 4*
4 8 3 2 9 0 1 5 6 7
8 3 9 0 2 1 5 7 4 6
7 0 4 8 3 6 9 1 5 2
4k Mode:

7 10 5 8 1 2 4 9 0 3 6**
6 2 7 10 8 0 3 4 1 9 5
9 5 4 2 3 10 1 0 6 8 7
1 4 10 3 9 7 2 6 5 0 8
8k Mode:

5 11 3 0 10 8 6 9 2 4 1 7*
10 8 5 4 2 9 1 0 6 7 3 11
11 6 9 8 4 7 2 1 0 10 5 3
8 3 11 7 9 1 5 6 4 0 2 10
```

For the permutation codes indicated above, the first two could be used in a two sequence cycle, whereas all four could be used for a four sequence cycle. In addition, some further sequences of four permutation codes, which are cycled through to provide the offset in an address generator to produce a good de-correlation in the interleaved symbols (some are common to the above) are provided below:

```
0.5k Mode:

3 7 4 6 1 2 0 5
4 2 5 7 3 0 1 6
5 3 6 0 4 1 2 7
6 1 0 5 2 7 4 3
2k Mode:

0 7 5 1 8 2 6 9 3 4*
3 2 7 0 1 5 8 4 9 6
4 8 3 2 9 0 1 5 6 7
7 3 9 5 2 1 0 6 4 8
4k Mode:

7 10 5 8 1 2 4 9 0 3 6**
6 2 7 10 8 0 3 4 1 9 5
10 3 4 1 2 7 0 6 8 5 9
0 8 9 5 10 4 6 3 2 1 7
8k Mode:

5 11 3 0 10 8 6 9 2 4 1 7*
8 10 7 6 0 5 2 1 3 9 4 11
11 3 6 9 2 7 4 10 5 10 8
10 8 1 7 5 6 0 11 4 2 9 3
```

*these are the permutations in the DVB-T standard
**these are the permutations in the DVB-H standard Examples of address generators, and corresponding interleavers, for the 2 k, 4 k and 8 k modes are disclosed in European patent application number 04251667.4, which corresponds to U.S. Patent Application Publication No. 2008/298487, the contents of which are incorporated herein lay reference. An address generator for the 0.5 k mode are disclosed in our co-pending UK patent application number 0722553.5, which corresponds to UK published application No. GB 2454722.

Various modifications may be made to the embodiments described above without departing from the scope of the present invention. In particular, the example representation of the generator polynomial and the permutation order which have been used to represent aspects of the invention are not intended to be limiting and extend to equivalent forms of the generator polynomial and the permutation order.

As will be appreciated the transmitter and receiver shown in FIGS. 1 and 7 respectively are provided as illustrations only and are not intended to be limiting. For example, it will be appreciated that the position of the symbol interleaver and the de-interleaver with respect, for example to the bit interleaver and the mapper can be changed. As will be appreciated the effect of the interleaver and de-interleaver is un-changed by its relative position, although the interleaver may be interleaving I/Q symbols instead of v-bit vectors. A corresponding change may be made in the receiver. Accordingly the interleaver and de-interleaver may be operating on different data types, and may be positioned differently to the position described in the example embodiments.

As explained above the permutation codes and generator polynomial of the interleaver, which has been described with reference to an implementation of a particular mode, can equally be applied to other modes, by changing the predetermined maximum allowed address in accordance with the number of sub-carriers for that mode.

As mentioned above, embodiments of the present invention find application with DVB standards such as DVB-T, DVB-T2 (published as EN 302 755) and DVB-H (published as ETSI EN 302 304 V1.1.1 (2004-11)), which are incorporated herein by reference. For example embodiments of the present invention may be used in a transmitter or receiver operating in accordance with the DVB-H standard, in handheld mobile terminals. The mobile terminals may be integrated with mobile telephones (whether second, third or higher generation) or Personal Digital Assistants or Tablet PCs for example. Such mobile terminals may be capable of receiving DVB-H or DVB-T/T2 compatible signals inside buildings or on the move in for example cars or trains, even at high speeds. The mobile terminals may be, for example, powered by batteries, mains electricity or low voltage DC supply or powered from a car battery. Services that may be provided by DVB-H may include voice, messaging, internet browsing, radio, still and/or moving video images, television services, interactive services, video or near-video on demand and option. The services might operate in combination with one another. In other examples embodiments of the present invention finds application with the DVB-T2 standard as specified in accordance with ETSI standard EN 302 755. In other examples embodiments of the present invention find application with the cable transmission standard known as DVB-C2. However, it will be appreciated that the present invention is not limited to application with DVB and may be extended to other standards for transmission or reception, both fixed and mobile.

The invention claimed is:

1. A data processing apparatus configured to map data symbols received from a predetermined number of sub-carrier signals of an Orthogonal Frequency Division Multiplexed (OFDM) symbol into an output symbol stream, the data processing apparatus comprising:
  a de-interleaver configured to read-into an interleaver memory the predetermined number of data symbols from the OFDM sub-carrier signals, and to read-out of the memory the data symbols into the output symbol stream to effect the mapping, the read-out being in a different order than the read-in, the order being determined from a set of addresses, with the effect that the data symbols are de-interleaved from the OFDM sub-carrier signals, and
  an address generator configured to generate the set of addresses, an address being generated for each of the received data symbols to indicate the OFDM sub-carrier signal from which the received data symbol is to be mapped into the output symbol stream, the address generator comprising:
    a linear feedback shift register including a predetermined number of register stages and being operable to generate a pseudo-random bit sequence in accordance with a generator polynomial,
    a permutation circuit configured to receive the content of the shift register stages and to permute the bits present in the register stages in accordance with a permutation code to form an address of one of the OFDM sub-carriers, and
    a control unit configured in combination with an address check circuit to re-generate an address when a generated address exceeds a predetermined maximum valid address, wherein
  the predetermined maximum valid address is less than one thousand and twenty four,
  the linear feedback shift register has nine register stages with a generator polynomial for the linear feedback shift register of $R'_i[8]=R'_{i-1}[0]\oplus R'_{i-1}[4]$, and the permutation code forms, with an additional bit, a ten bit address $R_i[n]$ for the i-th data symbol from the bit present in the n-th register stage $R'_i[n]$ in accordance with the table:

| $R'_i$ bit positions | 8 | 7 | 6 | 5 | 4 | 3 | 2 | 1 | 0 |
|---|---|---|---|---|---|---|---|---|---|
| $R_i$ bit positions | 4 | 3 | 2 | 1 | 0 | 5 | 6 | 7 | 8. |

2. The data processing apparatus as claimed in claim 1, wherein the predetermined maximum valid address is a value substantially between seven hundred and one thousand and twenty four.

3. The data processing apparatus as claimed in claim 1, wherein the OFDM symbol includes pilot sub-carriers, which are arranged to carry known symbols, and the predetermined maximum valid address depends on a number of the pilot sub-carrier symbols present in the OFDM symbol.

4. The data processing apparatus as claimed in claim 1, wherein the de-interleaver memory is arranged to effect the mapping of the received data symbols from the sub-carrier signals onto the output data stream for even OFDM symbols by reading in the data symbols according to a sequential order and reading out the data symbols from memory according to the set of addresses generated by the address generator, and for odd OFDM symbols by reading in the symbols into the memory in accordance with the set of addresses generated by the address generator and reading out the data symbols from the memory in accordance with a sequential order.

5. The data processing apparatus as claimed in claim 1, wherein the permutation circuit is configured to change the permutation code, which permutes the order of the bits of the register stages to form the addresses from one OFDM symbol to another.

6. The data processing apparatus as claimed in claim 5, wherein the permutation circuit is configured to cycle through a sequence of different permutation codes for successive OFDM symbols.

7. The data processing apparatus as claimed in claim 6, wherein the sequence of permutation codes comprises two permutation codes, which are:

| $R'_i$ bit positions | 8 | 7 | 6 | 5 | 4 | 3 | 2 | 1 | 0 |
|---|---|---|---|---|---|---|---|---|---|
| $R_i$ bit positions | 4 | 3 | 2 | 1 | 0 | 5 | 6 | 7 | 8 | and

| $R'_i$ bit positions | 8 | 7 | 6 | 5 | 4 | 3 | 2 | 1 | 0 |
|---|---|---|---|---|---|---|---|---|---|
| $R_i$ bit positions | 3 | 2 | 5 | 0 | 1 | 4 | 7 | 8 | 6. |

8. The data processing apparatus as claimed in claim 6 or 7, wherein the sub-carriers of the OFDM symbols are half or less than half a maximum number of sub-carriers in the OFDM symbols of any of a plurality of operating modes, and the data symbols include first sets of data symbols received from even OFDM symbols and second sets of data symbols received from odd OFDM symbols, and the data processing apparatus is operable to de-interleave the first and second sets of data symbols into the output data stream in accordance with an odd interleaving process,
  the odd interleaving process including:
    writing the first sets of data symbols received from the sub-carriers of the even OFDM symbols into a first part of the interleaver memory in accordance with an order determined by the set of addresses generated with one of the permutation codes of the sequence, reading out the first sets of data symbols from the first part of the interleaver memory into the output data stream in accordance with a sequential order of the first sets of input data symbols, writing the second set of data symbols received from the sub-carriers of the odd OFDM symbols into a second part of the interleaver memory in accordance with an order defined by the set of addresses generated with another of the permutation codes of the sequence, and reading out the second sets of data symbols from the second part of the interleaver memory into the output data stream in accordance with a sequential order of the second sets of input data symbols.

9. A receiver for receiving data from Orthogonal Frequency Division Multiplexing (OFDM) modulated signal, the receiver including a data processing apparatus configured to map data symbols received from a predetermined number of sub-carrier signals of an Orthogonal Frequency Division Multiplexed (OFDM) symbol into an output symbol stream, the data processing apparatus comprising:

a de-interleaver configured to read-into an interleaver memory the predetermined number of data symbols from the OFDM sub-carrier signals, and to read-out of the interleaver memory the data symbols into the output symbol stream to effect the mapping, the read-out being in a different order than the read-in, the order being determined from a set of addresses, with the effect that the data symbols are de-interleaved from the OFDM sub-carrier signals, and an address generator configured to generate the set of addresses, an address being generated for each of the data symbols to indicate the OFDM sub-carrier signal from which the data symbol is received is to be mapped from the interleaver memory into the output symbol stream, the address generator comprising:

a linear feedback shift register including a predetermined number of register stages and being operable to generate a pseudo-random bit sequence in accordance with a generator polynomial, a permutation circuit configured to receive the content of the shift register stages and to permute the bits present in the register stages in accordance with a permutation code to form an address of one of the OFDM sub-carriers, and a control unit configured in combination with an address check circuit to re-generate an address when a generated address exceeds a predetermined maximum valid address, wherein the predetermined maximum valid address is less than one thousand and twenty four, the linear feedback shift register has nine register stages with a generator polynomial for the linear feedback shift register of $R'_i[8]=R'_{i-1}[0]\oplus R'_{i-1}[4]$, and the permutation order forms, with an additional bit, a ten bit address $R_i[n]$ for the i-th data symbol from the bit present in the n-th register stage $R'_i[n]$ in accordance with the table:

| $R'_i$ bit positions | 8 | 7 | 6 | 5 | 4 | 3 | 2 | 1 | 0 |
|---|---|---|---|---|---|---|---|---|---|
| $R_i$ bit positions | 4 | 3 | 2 | | 1 | 0 | 5 | 6 | 7 | 8. |

10. The receiver as claimed in claim 9, wherein the receiver is configured to receive data which has been modulated in accordance with a Digital Video Broadcasting standard including the Digital Video Broadcasting-Terrestrial, Digital Video Broadcasting-Handheld, the Digital Video Broadcasting-Terrestrial2 standard or the Digital Video Broadcasting-Cable2 standard.

11. An address generator for use in receiving data symbols interleaved onto sub-carriers of an Orthogonal Frequency Division Multiplexed symbol, the address generator being operable to generate a set of addresses, each address being generated for each of the data symbols to indicate one of the sub-carrier signals from which the received data symbol is to be mapped from an interleaver memory into an output data stream, the address generator comprising:

a linear feedback shift register including a predetermined number of register stages and being configured to generate a pseudo-random bit sequence in accordance with a generator polynomial, a permutation circuit configured to receive the content of the shift register stages and to permute the bits present in the register stages in accordance with a permutation code to form an address, and a control unit configured in combination with an address check circuit to re-generate an address when a generated address exceeds a predetermined maximum valid address, wherein the predetermined maximum valid address is less than one thousand and twenty four, the linear feedback shift register has nine register stages with a generator polynomial for the linear feedback shift register of $R'_i[8]=R'_{i-1}[0]\oplus R'_{i-1}[4]$, and the permutation order forms, with an additional bit, a ten bit address $R_i[n]$ for the i-th data symbol from the bit present in the n-th register stage $R'_i[n]$ in accordance with a code defined by the table:

| $R'_i$ bit positions | 8 | 7 | 6 | 5 | 4 | 3 | 2 | 1 | 0 |
|---|---|---|---|---|---|---|---|---|---|
| $R_i$ bit positions | 4 | 3 | 2 | | 1 | 0 | 5 | 6 | 7 | 8. |

12. A method of mapping symbols received from a predetermined number of sub-carrier signals of an Orthogonal Frequency Division Multiplexed (OFDM) symbol into an output symbol stream, the method comprising:

reading-into an interleaver memory the predetermined number of data symbols from the OFDM sub-carrier signals, reading-out of the interleaver memory the data symbols into the output symbol stream to effect the mapping, the read-out being in a different order than the read-in, the order being determined from a set of addresses, with the effect that the data symbols are de-interleaved from the OFDM sub-carrier signals, and generating the set of addresses, an address being generated for each of the received data symbols to indicate the OFDM sub-carrier signal from which the received data symbol is to be mapped from the interleaver memory into the output symbol stream, the generating the set of addresses comprising:

using a linear feedback shift register including a predetermined number of register stages to generate a pseudo-random bit sequence in accordance with a generator polynomial, using a permutation circuit to receive the content of the shift register stages and to permute the bits present in the register stages in accordance with a permutation code to form an address, and re-generating an address when a generated address exceeds a predetermined maximum valid address, wherein the predetermined maximum valid address is less than one thousand and twenty four, the linear feedback shift register has nine register stages with a generator polynomial for the linear feedback shift register of $R'_i[8]=R'_{i-1}[0]\oplus R'_{i-1}[4]$, and the permutation order forms, with an additional bit, a ten bit address $R_i[n]$ for the i-th data symbol from the bit present in the n-th register stage $R'_i[n]$ in accordance with the table:

| $R'_i$ bit positions | 8 | 7 | 6 | 5 | 4 | 3 | 2 | 1 | 0 |
|---|---|---|---|---|---|---|---|---|---|
| $R_i$ bit positions | 4 | 3 | 2 | 1 | 0 | 5 | 6 | 7 | 8. |

13. The method as claimed in claim 12, wherein the predetermined maximum valid address is a value substantially between seven hundred and one thousand and twenty four.

14. The method as claimed in claim 12, wherein the OFDM symbol includes pilot sub-carriers, which are arranged to carry known symbols, and the predetermined maximum valid address depends on a number of the pilot sub-carrier symbols present in the OFDM symbol.

15. The method as claimed in claim 12, wherein the reading-into the interleaver memory the predetermined number of data symbols from the OFDM sub-carrier signals, and the reading-out of the interleaver memory the data symbols into the output symbol stream to effect the mapping, includes:

for even OFDM symbols, reading in the data symbols according to a sequential order, and reading out the data symbols from the interleaver memory according to the set of addresses generated by the address generator, and for odd OFDM symbols, by reading in the data symbols into the leaver memory in accordance with the set of addresses generated by the address generator, and reading out the data symbols from the memory in accordance with a sequential order.

16. The method as claimed in claim 12, wherein the using a permutation circuit to receive the content of the shift register stages and permuting the bits present in the register stages in accordance with the permutation code to form an address, includes changing the permutation code, which permutes the order of the bits of the register stages to form the addresses, from one OFDM symbol to another.

17. The method as claimed in claim 16, wherein the changing the permutation code, which permutes the order of the bits of the register stages to form the addresses, from one OFDM symbol to another includes cycling through a sequence of different permutation codes for successive OFDM symbols.

18. The method as claimed in claim 17, wherein the sequence of permutation codes comprises two permutation codes, which are:

| $R'_i$ bit positions | 8 | 7 | 6 | 5 | 4 | 3 | 2 | 1 | 0 |
|---|---|---|---|---|---|---|---|---|---|
| $R_i$ bit positions | 4 | 3 | 2 | 1 | 0 | 5 | 6 | 7 | 8 | and

| $R'_i$ bit positions | 8 | 7 | 6 | 5 | 4 | 3 | 2 | 1 | 0 |
|---|---|---|---|---|---|---|---|---|---|
| $R_i$ bit positions | 3 | 2 | 5 | 0 | 1 | 4 | 7 | 8 | 6. |

19. The method as claimed in claim 16, wherein the sub-carriers of the OFDM symbols are half or less than half a maximum number of sub-carriers in the OFDM symbols of any of a plurality of operating modes, the method comprising:

receiving first sets of data symbols from even OFDM symbols and second sets of data symbols from odd OFDM symbols, and the reading-into the interleaver memory the data symbols received from the OFDM sub-carrier signals, and the reading-out of the interleaver memory the data symbols into the output symbol stream to effect the mapping is in accordance with an odd interleaving process, the odd interleaving process including:

writing the first sets of data symbols received from the sub-carriers of the even OFDM symbols into a first part of the interleaver memory in accordance with an order determined by the set of addresses generated with one of the permutation codes of the sequence, reading out the first sets of data symbols from the first part of the interleaver memory into the output data stream in accordance with a sequential order of the first sets of input data symbols, writing the second set of data symbols received from the sub-carriers of the odd OFDM symbols into a second part of the interleaver memory in accordance with an order defined by the set of addresses generated with another of the permutation codes of the sequence, and reading out the second sets of data symbols from the second part of the interleaver memory into the output data stream in accordance with a sequential order of the second sets of input data symbols.

20. A method of receiving data from Orthogonal Frequency Division Multiplexing OFDM modulated symbols, the method comprising:

receiving a predetermined number of data symbols from a predetermined number of sub-carrier signals from the OFDM symbols for forming an output data stream, reading-into an interleaver memory the predetermined number of data symbols from the OFDM sub-carrier signals, reading-out of the interleaver memory the data symbols into the output symbol stream to effect the mapping, the read-out being in a different order than the read-in, the order being determined from a set of addresses, with the effect that the data symbols are de-interleaved from the OFDM sub-carrier signals, and generating the set of addresses, an address being generated for each of the received symbols to indicate the OFDM sub-carrier signal from which the received data symbol is to be mapped into the output symbol stream, the generating the set of addresses comprising:

using a linear feedback shift register including a predetermined number of register stages to generate a pseudo-random bit sequence in accordance with a generator polynomial, using a permutation circuit to receive the content of the shift register stages and to permute the bits present in the register stages in accordance with a permutation code to form an address, and re-generating an address when a generated address exceeds a predetermined maximum valid address, wherein the predetermined maximum valid address is less than one thousand and twenty four, the linear feedback shift register has nine register stages with a generator polynomial for the linear feedback shift register of $R'_i[8]=R'_{i-1}[0]\oplus R'_{i-1}[4]$, and the permutation order forms, with an additional bit, a ten bit address $R_i[n]$ for the i-th data symbol from the bit present in the n-th register stage $R'_i[n]$ in accordance with a code defined by the table:

| $R'_i$ bit positions | 8 | 7 | 6 | 5 | 4 | 3 | 2 | 1 | 0 |
|---|---|---|---|---|---|---|---|---|---|
| $R_i$ bit positions | 4 | 3 | 2 | 1 | 0 | 5 | 6 | 7 | 8. |

21. The method of receiving as claimed in claim 20, wherein the receiving the data symbols from the sub-carrier signals of the OFDM symbols is in accordance with a Digital Video Broadcasting standard including the Digital Video Broadcasting-Terrestrial, Digital Video Broadcasting-Handheld, the Digital Video Broadcasting-Terrestrial2 standard or the Digital Video Broadcasting-Cable2 standard.

* * * * *